United States Patent
Kaya

(10) Patent No.: US 7,898,783 B2
(45) Date of Patent: Mar. 1, 2011

(54) METHODS AND APPARATUS TO REDUCE SUBSTRATE VOLTAGE BOUNCES AND SPIKE VOLTAGES IN SWITCHING AMPLIFIERS

(75) Inventor: Cetin Kaya, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 604 days.

(21) Appl. No.: 11/940,396

(22) Filed: Nov. 15, 2007

(65) Prior Publication Data

US 2008/0061867 A1    Mar. 13, 2008

Related U.S. Application Data

(63) Continuation-in-part of application No. 11/834,601, filed on Aug. 6, 2007, now abandoned.

(60) Provisional application No. 60/822,030, filed on Aug. 10, 2006, provisional application No. 60/822,179, filed on Aug. 11, 2006.

(51) Int. Cl.
*H02H 3/20* (2006.01)
(52) U.S. Cl. ............... 361/91.1; 361/56; 361/90; 361/111; 327/535
(58) Field of Classification Search ............ 361/56
See application file for complete search history.

(56) References Cited

U.S. PATENT DOCUMENTS

| 5,021,860 | A  | * | 6/1991 | Bertotti et al. | 257/552 |
| 5,596,466 | A  | * | 1/1997 | Ochi | 361/18 |
| 7,078,964 | B2 | * | 7/2006 | Risbo et al. | 330/10 |
| 7,157,968 | B2 | * | 1/2007 | Shin | 330/251 |
| 7,576,396 | B2 | * | 8/2009 | Alberkrack et al. | 257/355 |

OTHER PUBLICATIONS

U.S. Appl. No. 11/940,691, "Methods and Apparatus to Reduce Substrate Voltage Bounces and Spike Voltages in Switching Amplifiers" filed on Nov. 15, 2007, inventors: Kaya et al.

* cited by examiner

*Primary Examiner*—Jared J Fureman
*Assistant Examiner*—Terrence R Willoughby
(74) *Attorney, Agent, or Firm*—John J. Patti; Wade J. Brady, III; Frederick J. Telecky, Jr.

(57) ABSTRACT

Methods and apparatus to reduce voltage bounces and spike voltages in switching amplifiers are disclosed. An example method of removing a substrate current from a substrate disclosed herein comprises injecting the substrate current via turning on an active device, forming a low impedance path to ground via a substrate clamp based on the substrate current, and removing the substrate current from the substrate via the substrate clamp.

12 Claims, 12 Drawing Sheets

METHODS AND APPARATUS TO REDUCE SUBSTRATE VOLTAGE BOUNCES AND SPIKE VOLTAGES IN SWITCHING AMPLIFIERS

CROSS REFERENCE TO RELATED APPLICATIONS

This patent is a continuation-in-part of U.S. patent application Ser. No. 11/834,601, filed Aug. 6, 2007, which claims the benefit of U.S. Provisional Patent Applications bearing Ser. Nos. 60/822,030 and 60/822,179, filed on Aug. 10, 2006 and Aug. 11, 2006, respectively. All of the foregoing United States Patent Applications and United States Provisional Patent Applications are hereby incorporated by reference in their entireties.

FIELD OF THE DISCLOSURE

This disclosure relates generally to integrated circuits and, more particularly, to methods and apparatus to reduce substrate voltage bounces and spike voltages in switching amplifiers.

BACKGROUND

In recent years, the devices used to implement switching amplifiers have increased in performance, thereby improving audio fidelity. As the audio fidelity of switching amplifiers improves, switching amplifiers have been increasingly implemented in consumer electronics. Generally, switching amplifiers are high efficiency amplifiers that were initially used in electronic devices requiring power efficiency, such as mobile phones and other portable electronic devices.

However, switching amplifiers are increasingly being implemented in stationary electronic devices such as home entertainment devices (e.g., televisions, surround sound receivers, etc.). In such electronic devices, the switching amplifiers are implemented to have higher power output than switching amplifiers used in portable electronics. For example, switching amplifiers may be implemented in a high-fidelity surround sound receiver having a total power output of hundreds of watts. In such cases, switching amplifiers may implemented in place of linear amplifiers (e.g., a class A amplifier) because the large number of amplifiers required (e.g., seven amplifiers for surround sound) and the relatively low efficiency of class A amplifiers.

Furthermore, switching half-bridge amplifier circuits are commonly used in the output stage(s) of many types of electronic amplifiers, such as, for example, class-D audio amplifiers. In a typical configuration, a switching half-bridge amplifier, or output amplification stage, includes a high-side transistor and a low-side transistor. Field effect transistors (FETs) are commonly used to implement half-bridge amplifiers. In an example FET-based implementation, the output of the half-bridge amplifier is provided at the node at which the source of the high-side FET is coupled with the drain of the low-side FET.

During typical operation, the output of such a half-bridge amplifier is switched between a high-side voltage substantially equal to the drain voltage of the high-side FET and a low-side voltage substantially equal to the source voltage of the low-side FET. The output of the half-bridge amplifier is switched to the high-side voltage by switching both the high-side FET ON and the low-side FET OFF. Conversely, the output of the half-bridge amplifier is switched to the low-side output voltage by switching both the high-side FET OFF and the low-side FET ON. In other words, the high-side FET and the low-side FET are controlled in a complimentary, yet opposite, fashion. In many switching half-bridge amplifier implementations, transient spikes in the output voltage occur when the voltage output is switched from the high-side output voltage to the low-side output voltage, and vice versa.

BRIEF DESCRIPTION OF THE DRAWINGS

FIGS. 5A-5D illustrate cross sections of a substrate implementing the switching amplifier of FIG. 4 at different stages during a device turn-on.

Figure 1:
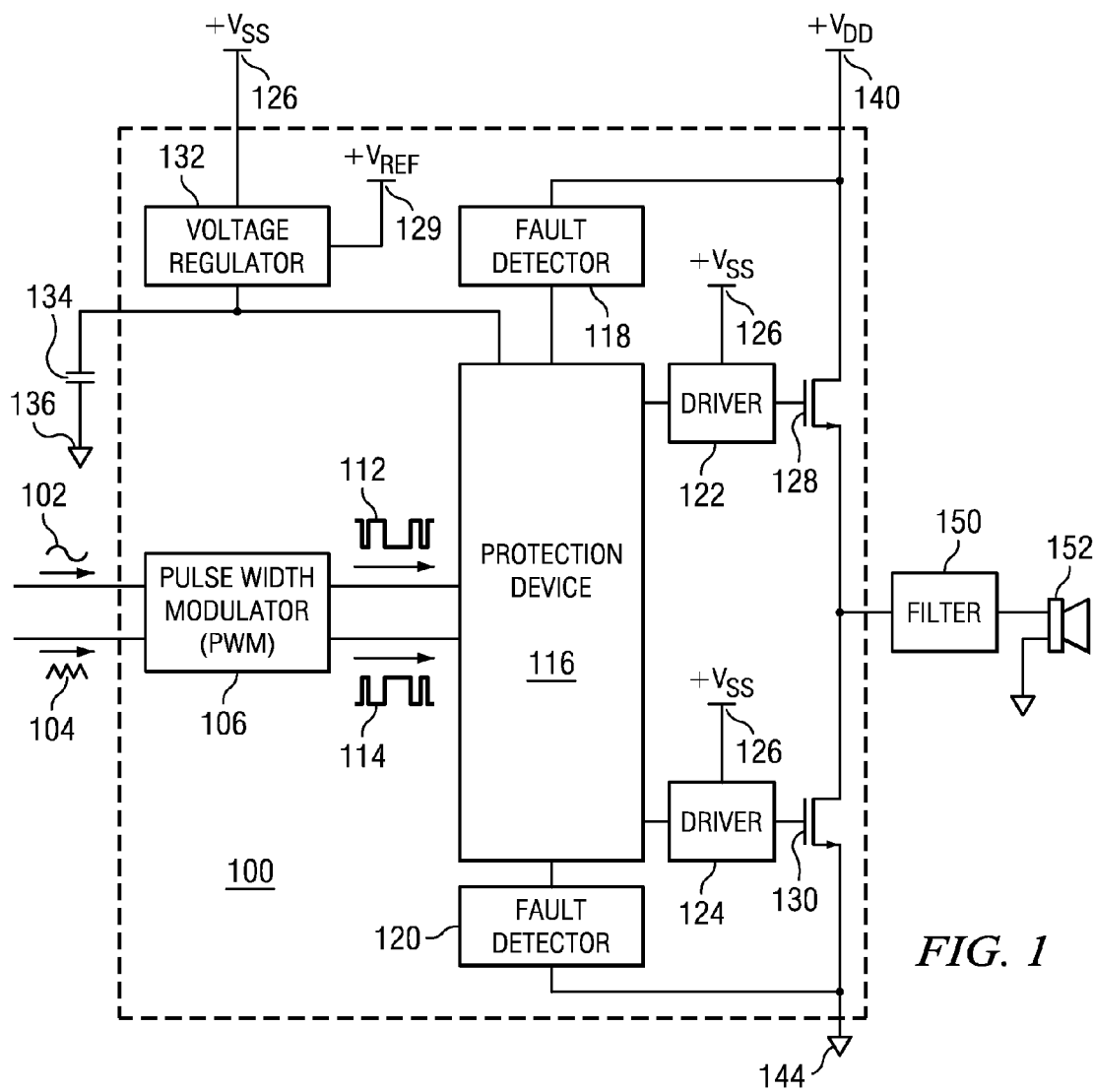
FIG. 1 is an illustration of an example switching amplifier.

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Methods and apparatus to reduce substrate voltage bounces and voltage spikes in switching amplifiers are disclosed herein with reference to certain examples. As described herein, an integrated circuit is a die or a chip containing at least one active semiconductor device (e.g., an NPN transistor, etc.). Thus, for example, an integrated circuit may contain a single active device (e.g., a transistor) or the integrated circuit may contain multiple active devices (e.g., a processor having millions of transistors). Although the examples disclosed herein describe and address substrate bounce effects in switching amplifiers, the teachings herein may be used in any device that suffers from substrate bounce effects, or substrate currents due to parasitics associated with the integrated circuit.

FIG. 1 is an illustration of an example switching amplifier 100 that may be implemented into an electronics device (e.g., a cellular phone, a stereo, etc.). Generally, the example switching amplifier 100 is implemented on a silicon wafer (e.g., a P-type wafer, etc.) and packaged into an integrated circuit that will be implemented into the electronics device. The example switching amplifier 100 receives an input signal 102 and a reference signal 104 at a pulse width modulator (PWM) 106. Using the reference signal 104 and the signal 102, the pulse width modulator 106 forms a first PWM signal 112 and a second PWM signal 114. Persons having ordinary skill in the art will readily appreciate that the PWM signals 112, 114 are indicative of the power spectral density of signal 102. As illustrated in the example of FIG. 1, the PWM signals 112, 114 are complementary to each other.

The PWM signals 112, 114 are received by a protection device 116, which includes functionality to protect the example switching amplifier 100. For example, the protection device 116 may detect shorts, overheating, and so forth.

Figure 2:
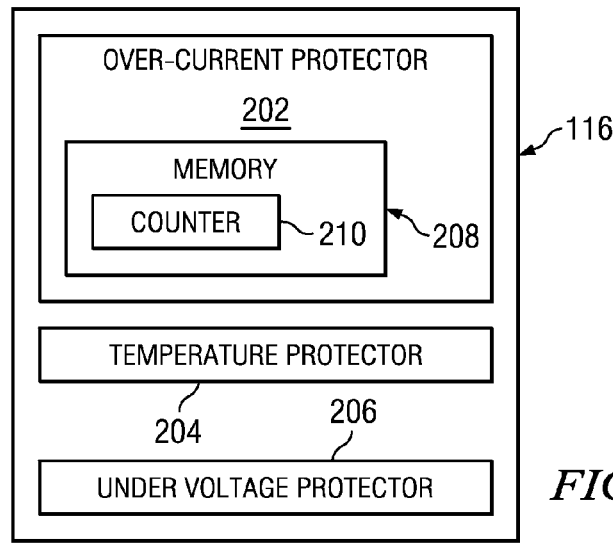
FIG. 2 is an illustration of a protection device of the switching amplifier of FIG. 1.

FIG. 2 illustrates the protection device 116 in more detail. In the example of FIG. 2, the protection device 116 includes an over-current protector 202 to detect shorts, a temperature protector 204 to detect overheating, and an under-voltage protector 206 to detect voltages. However, the protection device 116 may include any number of devices to protect the switching amplifier 100 and its associated devices.

In the example of FIG. 1, the protection device 116 is further coupled to a first and second fault detectors 118 and 120. In the example of FIG. 1, the fault detectors 118, 120 sense the current in the switching amplifier 100 to determine if there is an over-current condition (i.e., the current exceeds a predetermined limit). The fault detectors 118, 120 communicate with the over-current protector 202 to indicate an over-current condition. The protection device 116 also conveys the PWM signal 112 to a first gate driver 122 and the PWM signal 114 to a second gate driver 124. The gate drivers 122, 124 are both coupled with a voltage source VSS 126. The gate drivers 122, 124 are also coupled to a first and second switch 128 and 130, respectively (which are typically LDMOS devices).

The gate drivers 122, 124 amplify the PWM signals 112, 114 to drive the switches 128, 130, respectively. In the example of FIG. 1, the switches 128, 130 are implemented by lightly doped metal oxide semiconductor field effect transistors (LDMOS). The LDMOS devices are implemented in the switching amplifier 100 to handle the high switching frequency of the PWM signals 112, 114. However, the switches 128, 130 may be implemented by any suitable device (e.g., NPN transistors, etc.).

In the example of FIG. 1, the drain of the LDMOS device 128 is coupled to a voltage source VDD 140. The fault detector 118 senses the current flowing between the LDMOS device 128 and the voltage source 140. The source of the LDMOS device 130 is coupled to ground 144 (e.g., a low voltage source, etc.). The fault detector 120 senses the current flowing between the LDMOS device 130 and the ground 144. The source of LDMOS devices 128 and the drain of LDMOS device 130 are both coupled together and further coupled to a playback device 152 (e.g., a speaker, etc.) via a filter 150.

As described above, the drivers 122, 124 amplify the PWM signals 112, 114, to drive the LDMOS 128, 130 devices, respectively. The LDMOS devices 128, 130 rapidly turn on and off based on the voltage of the PWM signals 112, 114. In other words, the LDMOS devices 128, 130 reproduce the PWM signals 112, 114 via their respective sources. However, the PWM signal 114 provided via the LDMOS device 130 will be inverted (i.e., the voltage will be negative). The PWM signals 112, 114 are then summed at the source of the LDMOS devices 128, 130. The summed PWM signal is conveyed to the playback device 152 via the filter 150, which filters the summed PWM signal to form the output signal.

In some examples, when the LDMOS device 128 is turned on, current flows into the filter 150 via the LDMOS device 128. However, the filter 150 may store energy (e.g., by having an inductor or capacitor). As a result, when the LDMOS device 128 is turned off and the LMDOS device 130 is turned on, the LDMOS device 130 draws current from the filter 150 to cause the output signal to have a negative voltage swing. After filtering, the output signal is substantially similar to the input signal 102 (i.e., the output signal is audibly similar to the input signal 102), however, the output signal has more power. The output signal is received by the playback device 152, which audibly presents the output signal to a listener. Thus, the switching amplifier 100 is a high fidelity amplifier that reproduces the input signal to audibly present to the listener.

In addition, the voltage source 126 is coupled with a voltage regulator 132. The voltage regulator 132 is also coupled to a voltage reference 129, which is a voltage reference (e.g., a bandgap reference) that is generated within the switching amplifier 100 (i.e., the voltage reference is generated in the integrated circuit). Using the voltage reference 129, the voltage regulator 132 outputs a regulated voltage (e.g., 3.3 volts) for the protection device 116. In addition, the output of the voltage regulator 132 is coupled to ground 136 via a capacitor 134. In the example of FIG. 1, the capacitor 134 stores a voltage (e.g., 3.3 volts) and sources additional current to the protection device 116 when the voltage regulator 132 cannot supply enough current to the switching amplifier 100. Thus, the capacitor 134 is configured to store energy (e.g., a tank) for the operation of the switching amplifier 100.

In the example of FIG. 2, the over-current protector 202 may be implemented by any suitable device (e.g., a processor, a logic circuit, etc.) having a memory 208. In such examples, the memory 208 is generally a volatile memory, however, the memory 208 may be implemented by any type of memory (e.g., flash memory, registers in a processor, etc.). Generally, in a switching amplifier 100, the current output from the switching amplifier 100 increases and decreases rapidly based on the input signal 102. In such examples, one method to determine if there is a short in the switching amplifier 100 is to count the number of times the current in the LDMOS devices 128, 130 exceed a predetermined current limit.

In some examples, the over-current protector 202 implements a counter 210 in the memory 208 to count the number of times the current passed through LDMOS devices 128, 130 exceed a threshold within a predetermined time period (e.g., 10 milliseconds) based on input from fault detectors 118, 120, which determine if the current flowing via either of the LDMOS devices 128, 130 exceed a current limit (e.g., 30 amps). In the event that the current through the LDMOS devices 128, 130 exceeds the current limit, the fault detector that detects the current communicates a signal to the over-current protector 202 to indicate an over-current condition. The over-current protector 202 receives the signal and, as a result, increments the counter 210 and stores it in memory 208. After incrementing the counter 210, the over-current protector 202 compares the counter 210 with a predetermined value that may be indicative of an over-current condition (e.g., 15). If the counter 210 exceeds the predetermined value, the over-current protector 202 disables the switching amplifier 100 by, for example, interrupting the PWM signals from being coupled to the drivers 122,124 to protect the switching amplifier 100 and its associated devices (e.g., the playback device 152).

Figure 3:
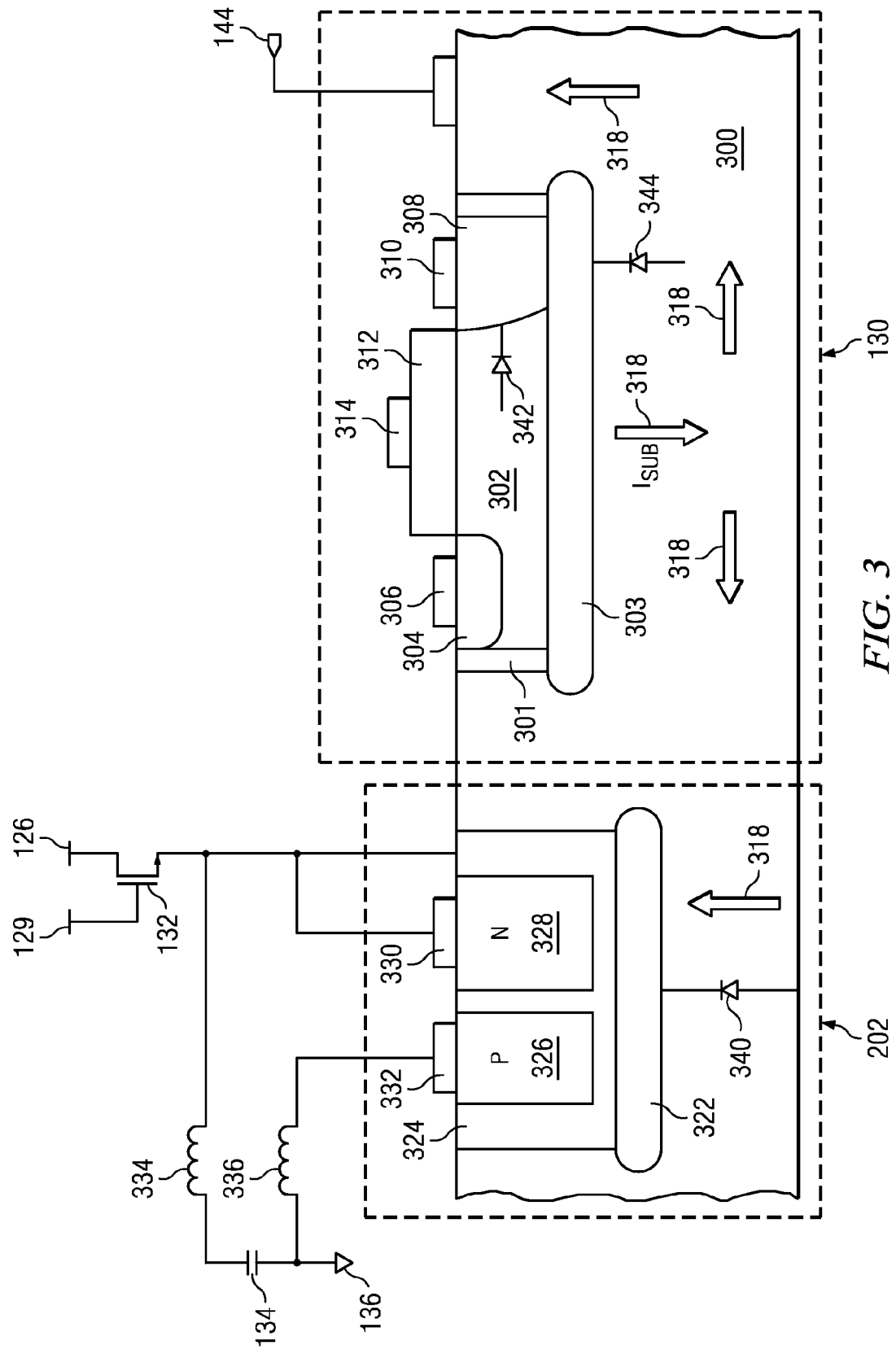
FIG. 3 is a cross section of a substrate implementing a switching amplifier.

In some examples, the LMDOS devices 128, 130 are high power devices capable of handling large currents (e.g., over 25 amps). In the example of FIG. 1, parasitics (e.g., capacitance, etc.) associated with the LDMOS devices 128, 130 may cause current to leak into the substrate of the silicon wafer. FIG. 3 illustrates a cross-sectional view of a substrate 300 that may implement the switching amplifier 100. In the example of FIG. 3, the substrate 300 is implemented by a P-type silicon wafer. However, the substrate 300 may be implemented by any suitable material (e.g., silicon germanium, silicon, gallium arsenide, gallium nitride, etc.).

FIG. 3 also illustrates a cross-section of the LDMOS device 130. In the example of FIG. 3, the LDMOS device 130 is a simplified illustration of an LDMOS device and is included to show its associated parasitics and currents. The LDMOS device 130 is formed in an N-well 301 disposed in the substrate 300 that includes a P-well 302 disposed within the N-well 301. An N-buried layer 303 rests below the N-well 301. The N-buried layer 303 isolates the devices formed above or within the N-buried layer 322 from parasitics, noise, and other effects from devices of the substrate 300.

A first N-well 304 (i.e., a silicon region that is implanted with N-type ions to make the region an N-type region) is disposed in the P-well 303. A pad 306 (e.g., a poly-silicon pad, a metal, etc.) is in contact with the N-well 304. A second N-well 308 is also disposed in the substrate 300 and in contact with the N-buried layer 303. The N-well 308 also includes a pad 310 in contact with the N-well 308. An oxide layer 312 is placed on the top surface of the substrate 300 and is disposed between the N-wells 304, 308. A pad 314 (e.g., a poly-silicon, etc.) is in contact with the oxide layer 312 to form the gate of the LDMOS device 128. In the example of FIG. 3, the pad 310 forms the drain of the LDMOS device 128 and the pad 306 forms the source of the LDMOS device 128. In addition, the bottom surface of the substrate 300 is coupled to a low voltage source (e.g., the ground 144, etc.).

The example of FIG. 3 also includes a device disposed in the substrate 300 via a complementary metal oxide semiconductor (CMOS) process, which forms N-channel devices and P-channel devices in the substrate 300. One such device that may disposed in the substrate 300 is the over-current protector 202, however, any device may be placed in the substrate (e.g., logic, etc.). In the example of FIG. 3, the over-current protector 202 is isolated from devices by placing a deep N-buried layer 322 disposed in the substrate 300. A deep N-well 324 is disposed above the N-buried layer 322 and a P-well 326 and an N-well 328 are disposed within the N-well 324. In the example of FIG. 3, the N-well 328 implements the P-channel devices (not shown) of the over-current protector 202 and the P-well implements the N-channel devices (not shown) of the over-current protector 202. The devices of the P-well 326 are in contact at least one pad 332 and the devices of the N-well 328 are in contact with at least one pad 330.

The P-well 326 is coupled to the ground 136 via any suitable device (e.g., a bond wire, etc.) and the N-well 328 is coupled to the capacitor 134 via any suitable device (e.g., a bond wire, a metal trace, etc.). The capacitor 134 is further coupled to ground 136. Ideally, the N-well 328 is coupled via a path without any parasitics. However, because the capacitor 134 is located on the circuit board, a parasitic inductor 334 is included in the example of FIG. 3 to illustrate an inductance (e.g., 5 nH) between the capacitor 134 and the N-well 328. Similarly, the P-well 326 includes a parasitic inductor 336 (e.g., 5 nH).

As described above, the voltage regulator 132 outputs a voltage and the capacitor 134 stores charge to supply to the voltage regulator 132 when there is large demand for current. As illustrated in the example of FIG. 3, the capacitor 134 is coupled to the pad 330 of the N-well 328. The contact 332 of the P-well 326 is coupled to the analog ground 136 (e.g., a chip level ground, etc.) via any suitable connector (e.g., a bond wire, a pad, etc.).

Generally, the devices disposed in the substrate 300 include many parasitic effects that may or may not affect the switching amplifier 100. For example, in the example of FIG. 3, due to the P-type substrate 300 and N-buried layer 322, a parasitic p-n junction exists between the P-type substrate 300 and the N-buried layer 322. Thus, a diode 340 is included in the example of FIG. 3 to illustrate the parasitic diode formed by the P-type substrate 300 and the N-buried layer 222. Normally, the diode 340 is reverse biased to isolate devices of the substrate 300. Still, in other examples, the LDMOS device 130 includes a parasitic p-n junction represented by a diode 342 is formed between the N-well 308 and the P-well 302 and a parasitic p-n junction represented by a diode 344, which is formed between the N-well 308 and the P-type substrate 300. Thus, in some examples, current may flow from the P-regions (e.g., the P-type substrate 300, the P-well 302, etc.) into the N-well 308.

In the example of FIG. 1, when the LDMOS device 130 is turned off and the LDMOS 128 is transitioning to a high state (e.g., turning on), due to the stored energy in the filter 150, a small amount of current may leak in the drain of the LDMOS device 130 due to the parasitic diodes 342, 344. In such a case, the drain of LDMOS device 130 has a negative voltage due to the parasitic current flowing via its drain. As the LDMOS device 128 turns on and drives the voltage at the drain of the LMDOS device 130 high, minority charge carriers injected into the substrate 300 via the N-well 308 and the N-buried layer 303 are swept back across the junction. At the same time, LDMOS device 128 is conducting a large current into the playback device 152 via the filter 150. At the same time, for a brief moment, current from LMDOS device 128 may be injected into the substrate 300, thereby forming a substrate current 318. In some examples, the substrate current 318 may be a significant current (e.g., 4 amps).

The substrate current 318 disperses and seeks the path of least impedance (i.e., resistance) to a low voltage source (e.g., ground 136, ground 144, etc.). However, in some examples, the substrate current 318 may flow into ground 136 via the over-current protector 202. As described above, there is a parasitic diode 340 between the P-type substrate 300 and the N-buried layer 322, which can pass the substrate current 318 to ground 136. In such examples, the voltage of the substrate 300 must be larger than the voltage of the N-well 328 due to the voltage drop from the diode 340. Thus, the voltage of the substrate 300 is the voltage of the N-well 328 summed with the voltage drop of the diode 340 (e.g., 0.7 volts). In some examples, the voltage of the N-well 328 is larger than the voltage of the capacitor 134 due to the parasitic inductance 334 (e.g., 3.6 volts). As a result of the substrate current 318 flowing in the substrate 300, the diode 340 becomes forward biased and causes the substrate 300 to have a positive voltage (e.g., 4.3 volts). In such a case, because the substrate current 318 is brief in duration, the substrate current 318 will flow across the diode 340 and then into ground 136 via the capacitor 134.

After the charge carriers are removed from the substrate 300, the substrate current 318 diminishes (i.e., there is no more substrate current 318 or the substrate current 318 is negligible). As a result, there is no current in the substrate 300 to forward bias the diode 340. Persons having ordinary skill in the art will readily appreciate that charge carriers injected into the N-buried layer 322 during forward bias are removed across the junction between the N-buried layer 322 and the substrate 300, thereby causing a negative current to flow across the diode 340 and causing the substrate 300 to have a low voltage (i.e., reverse recovery). Thus, the voltage of the N-well 328 is substantially reduced (e.g., to zero volts) for a brief moment while the diode 340 recovers. Due to the low voltage difference between the N-well 328 and the P-well 326, the voltage output by the voltage regulator 132 drops below the minimum threshold voltage.

As described above, the over-current protector 202 includes a memory 208 to store the number of over-current conditions that have occurred. Generally, the memory 208 must be held to a minimum voltage (e.g., 1.5 volts) to store the values contained therein. In the example of FIG. 1, the voltage regulator 132 supplies the voltage to the memory 208. However, as described above, substrate current 318 causes the voltage regulator 132 to briefly drop in voltage during low-to-high transitions of the LDMOS device 128. As a result, the voltage of the voltage regulator 132 may drop below the minimum threshold voltage (e.g., 1.5 volts), thereby turning off the memory 208 and clearing its contents (i.e., values, instructions, etc.). Thus, the memory 208 of the over-current protector 202 is reset, thereby clearing the value of the counter 210 and preventing the over-current protector 202 from detecting over-current conditions.

In other words, the low-to-high transitions of the LDMOS device 128 may cause the LDMOS device 130 to inject a substrate current into the substrate 300 and cause the over-current protector 202 to briefly drop in voltage, thereby preventing the over-current protector 202 from detecting over-current conditions. In such a case, because the over-current protector 202 cannot properly count over-current conditions in the LDMOS devices 128, 130, the over-current protector 202 cannot detect short circuits, which may lead to damage to the switching amplifier 100 and its associated devices (e.g., playback device 152).

Figure 4:
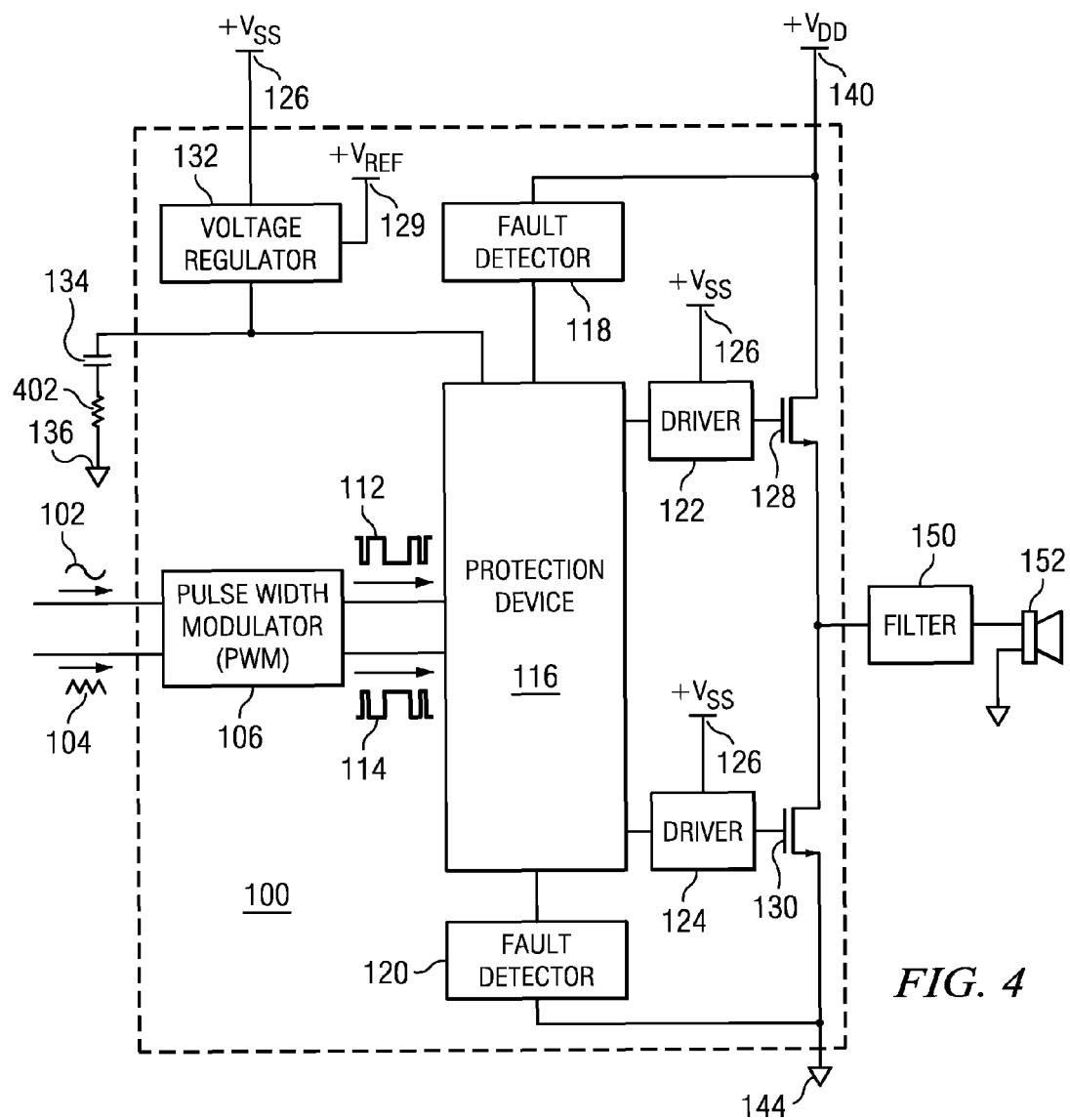
FIG. 4 is an illustration of another example switching amplifier implementing a substrate current protector.

FIG. 4 illustrates the example switching amplifier 100 implementing a substrate current protector. The substrate current protector is implemented by floating the capacitor 134 (i.e., not connected to an independent node such as a ground or voltage source) and coupling the capacitor 134 to ground 136 via resistor 402 having a low resistance (e.g., 3.3 ohms). In other words, the protection device 116, which receives voltage from the voltage regulator 132, is coupled to ground via the capacitor 134 and the resistor 402.

Figure 5A:
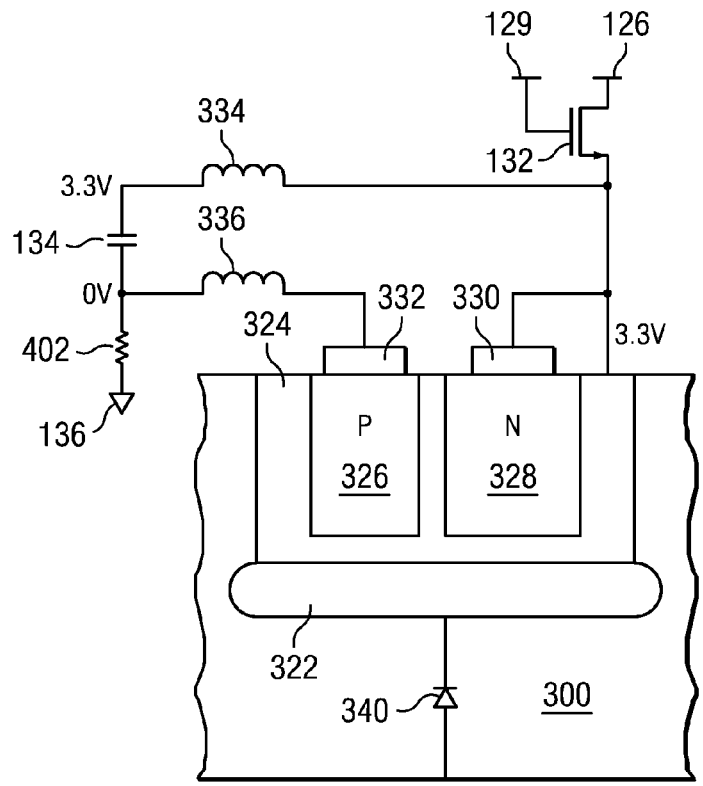

FIGS. 5A-5D illustrates a cross section view of the substrate 300 that implements the switching amplifier 100 coupled to the resistor 402. In the examples of FIGS. 5A-5D, different stages of the over-current protector 202 are illustrated when the LDMOS device 130 injects the substrate current 318. As illustrated in FIG. 5A, the P-well 326 is coupled to ground 136 via the resistor 402. Similarly, N-well 328 is coupled to ground via the capacitor 134 and the resistor 402. In addition, the N-well 328 is coupled to the voltage regulator 132 and receives a regulated voltage.

Initially, as illustrated in the example of FIG. 5A, the LDMOS device 130 is turned off and the voltage regulator 132 supplies voltage (e.g., 3.3 volts) to the over-current protector 202. Initially, no current flows from the P-well 326 to ground via the resistor 402, thus the P-well 326 has a voltage of zero volts. At the same time, the voltage applied to the N-well 328 is the regulated voltage (e.g., 3.3 volts).

Figure 5B:
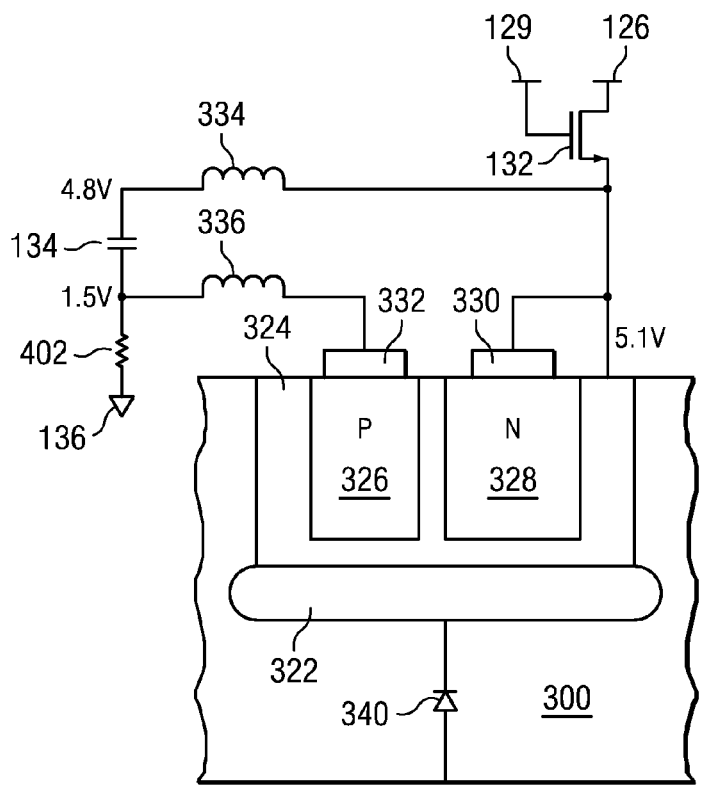

As illustrating in FIG. 5B, when the LDMOS device 128 turns on and causes the LDMOS device 130 to inject the substrate current 318, the substrate current 318 flows into the substrate 300 and forward biases the diode 340. In such a case, the substrate current 318 will flow across the capacitor 134 and into the resistor 402, creating a voltage across the resistor 402 (e.g., 1.5 volts). Due to the voltage between the resistor 402 and the capacitor 134, the voltage at the capacitor 134 increases (e.g., 4.8 volts). In some examples, the parasitic inductance 334 causes the voltage of the N-well 328 to be higher (e.g., 5.1 volts). As a result of the substrate current 318 flowing via the diode 340, the substrate 300 has a higher voltage than the N-well 328 (e.g., 5.8 volts).

Figure 5C:
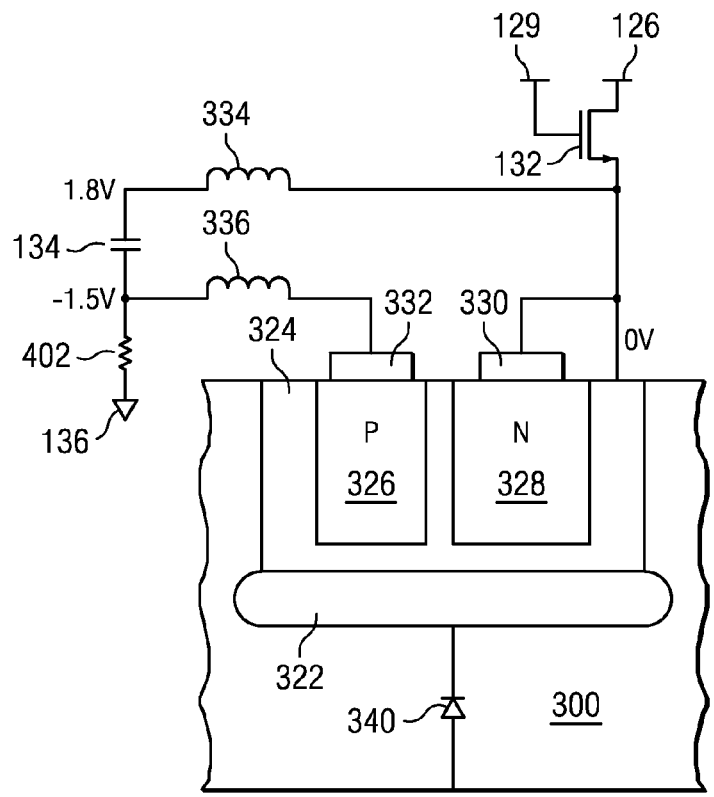
Figure 5D:
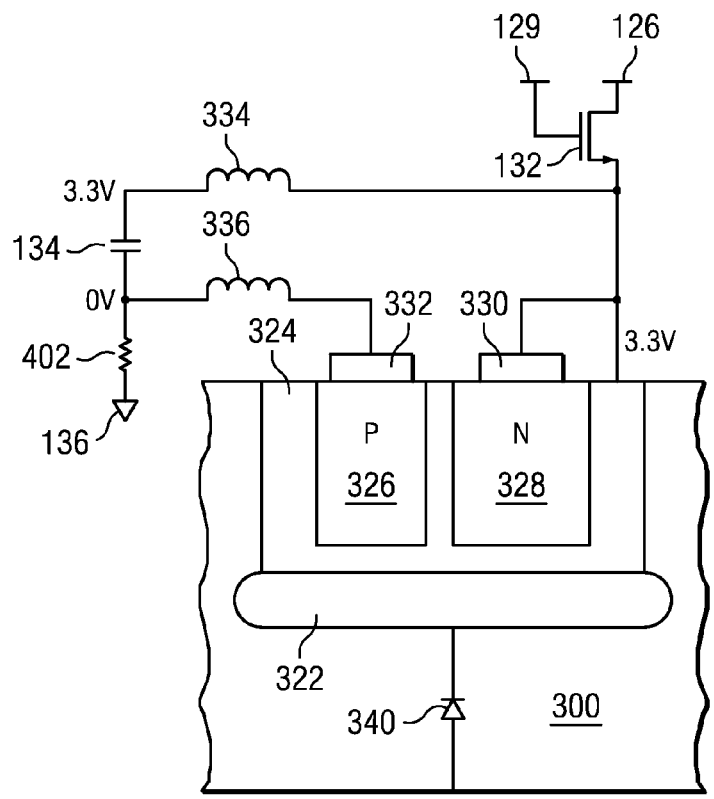

In the example of FIG. 5C, when charge carriers of the parasitic diodes 342, 344 of the LDMOS device 130 are swept back across their respective junctions, the substrate current (not shown) diminishes and cannot forward bias the diode 340. However, as described above, the reverse recovery of the diode 340 creates a negative voltage and reduces the voltage of the N-well 328 (e.g., to zero volts). The negative current is provided via ground 136, thereby creating a negative voltage across the resistor 402 and at the P-well 326 (e.g., to −1.5 volts). The voltage of the capacitor 134 is also reduced based on its voltage (e.g., to 1.8 volts). However, the voltage of the N-well 328 is reduced (e.g., to zero volts), but the difference in the voltages between the P-well 326 and the N-well 328 (e.g., 1.5 volts) cause the over-current protector 202 to maintain a voltage that exceeds the minimum threshold voltage. Thus, by floating both the capacitor 134 and the P-well 326, the resistor 402 prevents the voltage of the voltage regulator 132 from falling below the minimum threshold value. As a result, the resistor 402 prevents the memory 208 from clearing due to the substrate current (not shown) injected via the LDMOS device 130. After the diode 340 has recovered, the over-current protector 202 returns to its normal voltage (e.g., 3.3 volts) as shown in the example of FIG. 5D.

Figure 6:
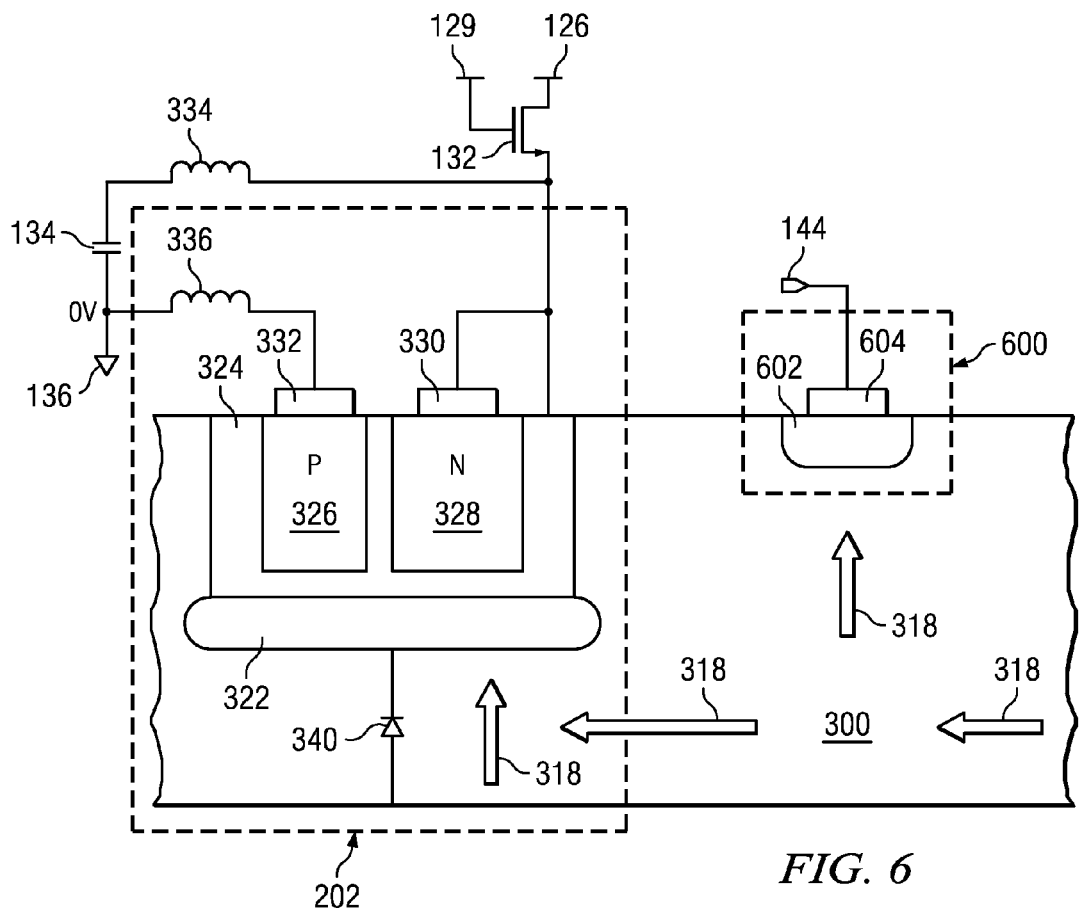
FIG. 6 is a cross section of a substrate implementing a substrate clamp.

Another method to reduce the effects of the substrate current is to provide a path to ground to minimize the substrate current flowing in the substrate 300. In the example of FIG. 6, a substrate clamp 600 clamps portions of the substrate 300 to ground 144, thereby providing a path for the substrate current 318 to escape the substrate 300. FIG. 6 illustrates a substrate 300 implementing a substrate clamp 600 via a P-well 602 in contact with a pad 604, which is coupled to ground 144. As readily appreciated by persons having skill in the art, P-wells are formed by injecting ions (e.g., boron) into the silicon, thus freeing holes of the silicon to carry energy.

Figure 7:
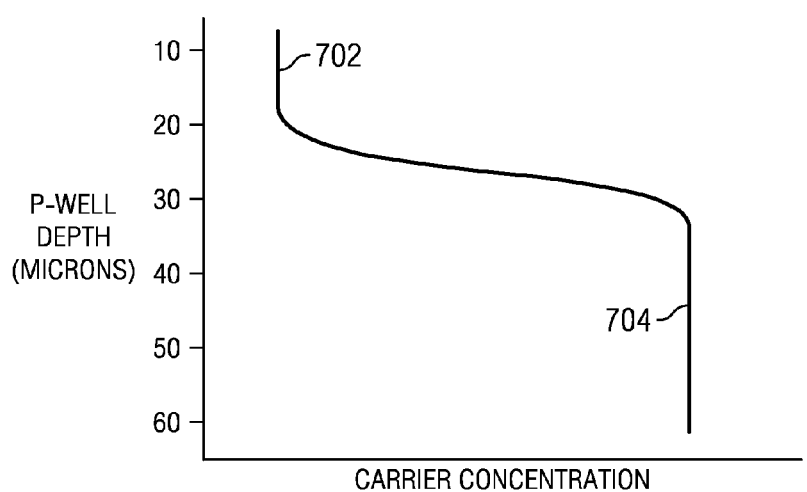
FIG. 7 illustrates the doping profile of the substrate clamp of FIG. 6.

FIG. 7 illustrates an example doping profile of the P-well 602. In the example of FIG. 7, the P-well has a lightly doped region 702 and a heavily doped region 704. Persons of ordinary skill in the art will readily recognize that the lightly doped region 702 has a larger resistance than the heavily doped region 704. In the example of FIG. 7, the lightly doped region 702 enables high voltage operation of the devices on the substrate 300. As a result, the resistive path of the lightly doped region 702 presents an impedance to the substrate currents, thereby reducing the amount of substrate current flowing from the substrate 300 via the P-well 602. The substrate current 318 chooses the easiest path to ground 144, thus the substrate current 318 exits via the over-current protector 202 and causes the over-current protector 202 to drop in voltage as explained in conjunction with FIG. 3.

Figure 8A:
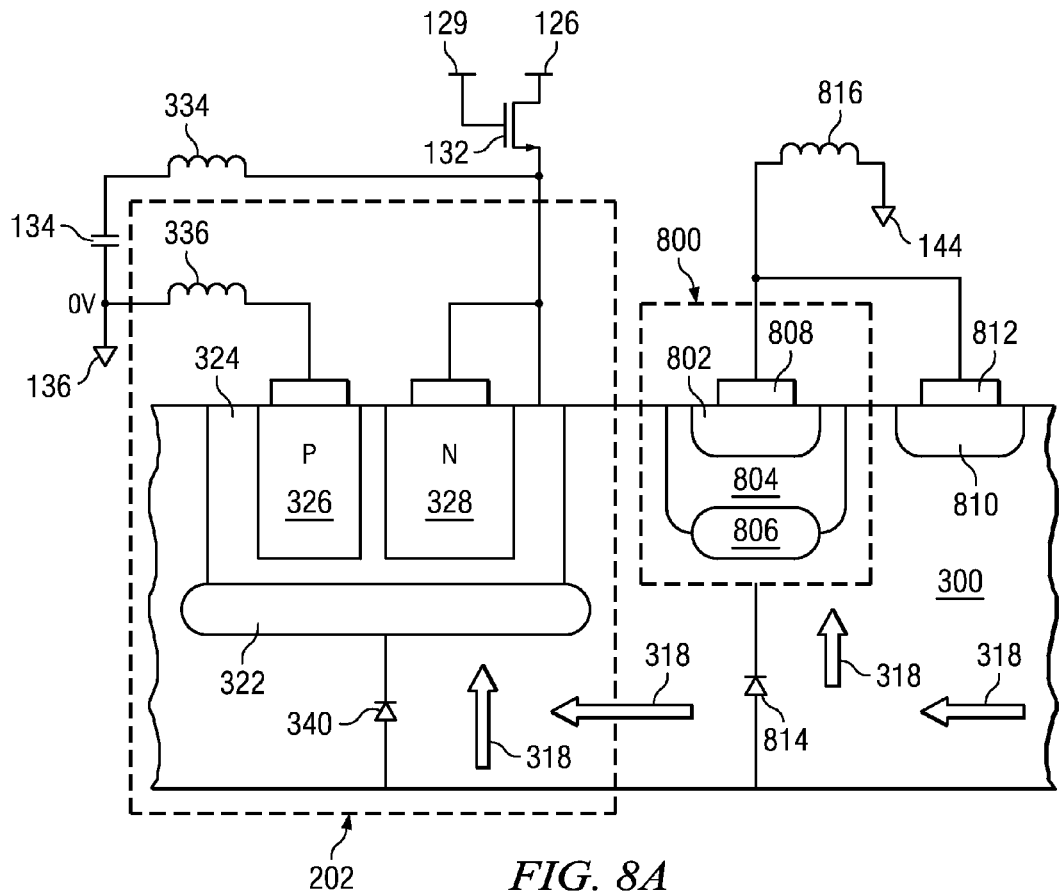
FIG. 8A illustrates a cross section of a substrate implementing another substrate clamp.

FIG. 8A illustrates substrate 300 implementing another substrate clamp 800 constructed differently from the substrate clamp 600 of FIG. 6. The substrate clamp 800 includes an N-well 802, a deep-N well 804, and an N-buried layer 806. In the example of FIG. 8, the deep N-well 804 is disposed in the substrate 300 and the N-well 802 is disposed in the deep N-well 804. The N-buried layer 806 is disposed in the substrate 300 below the deep N-well 804. A pad 808 is also in contact with the N-well 802. The N-well 802 is coupled to ground 144 to a P-well 810 via any suitable means (e.g., bond wires, plating, etc.). The P-well 810 is in contact with a pad 812 to connect to devices outside of the substrate 300 (e.g., ground, voltage sources, etc.). In the example of FIG. 8, the substrate clamp 800 and the P-well 810 are coupled to ground 144 via a parasitic inductance 816 (e.g., 5 nH).

Figure 8B:
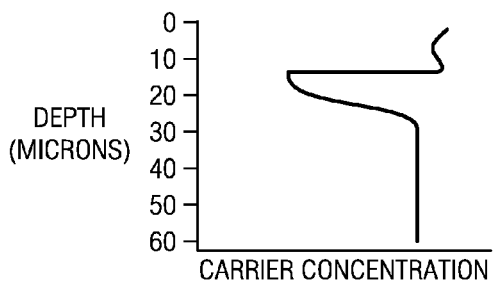
FIG. 8B illustrates the doping profile of the substrate clamp of FIG. 8A.

FIG. 8B illustrates a graph showing the doping profile of the substrate clamp 800. As illustrated in FIG. 8B, the substrate clamp 800 is heavily doped, thereby having a low impedance when current travels through it. As described above, when substrate currents flow into the substrate 300, a parasitic diode 814 is formed via the p-type substrate 300 and the N-buried layer 806. However, by forward biasing the parasitic diode 814, the substrate current 318 forms a low impedance path to ground 144 via the substrate clamp 800. Thus, the substrate 800 has a voltage, but due to the low impedance of the substrate clamp 800, the voltage of the substrate 300 is reduced. In addition, the voltage of the substrate 300 is not uniform, thereby substantially isolating the over-current protector 202 from the substrate current 318. Thus, the substrate clamp 800 substantially removes the substrate current 318 and substantially reduces the substrate voltage.

Figure 8C:
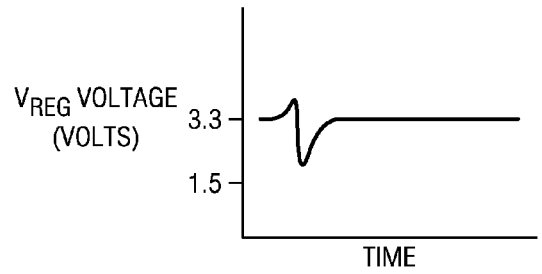
FIG. 8C illustrates the voltage drop of a substrate implementing the substrate clamp of FIG. 8A.

FIG. 8C illustrates a graph of the voltage of the over-current protector 202 with the substrate clamp 800 coupled to the P-well 810 via the parasitic inductance 816. As described above, most substrate current 318 escapes via the substrate clamp 800. However, during a low-to-high transition, the voltage of the over-current protector 202 is pulled down via the substrate current escaping via the over-current protector 202. In the example of FIG. 8A, the voltage of the voltage regulator 132 remains above a minimum voltage threshold (e.g., 1.5 volts) to allow the memory 208 to store the counter 210 associated with the over-current protector 202.

Figure 9:
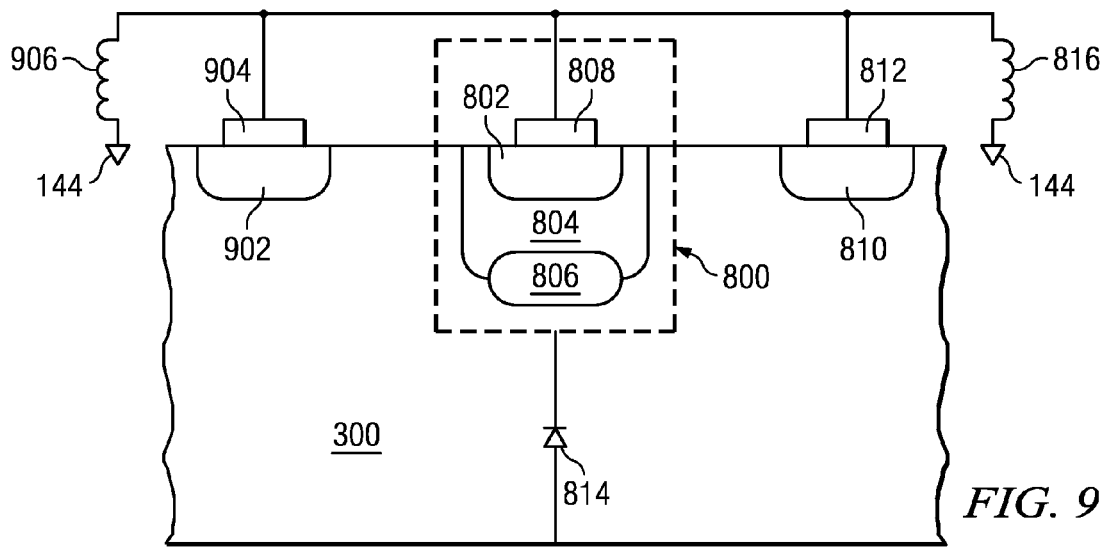
FIG. 9 illustrates a cross section of a substrate implementing another substrate clamp.
Figure 10:
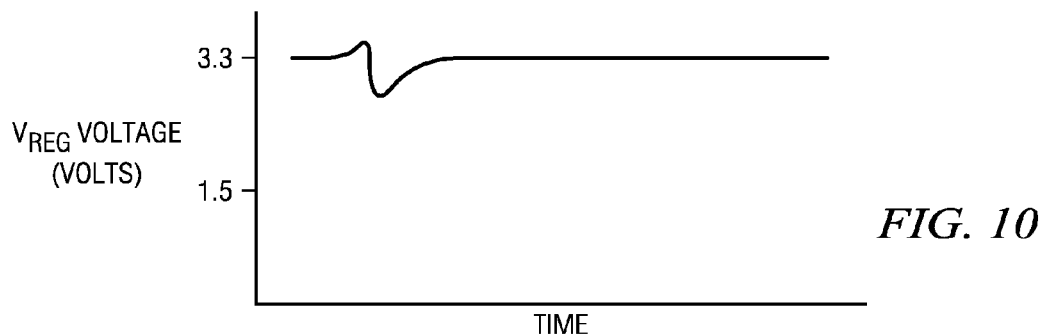
FIG. 10 illustrates the voltage drop of a substrate implementing the substrate clamp of FIG. 9.

FIG. 9 illustrates an example substrate clamp 800 implementing a second P-well 902 having a pad 904. The second P-well 902 is coupled to ground 144 and the substrate clamp 800. In the example of FIG. 9, the P-well 902 is coupled to ground 144 via parasitic inductance 906. However, the parasitic inductances 906, 816 are connected in parallel. By placing the parasitic inductances 906, 816 in parallel, the total inductance between the substrate clamp 800 and ground 144 decreases. The substrate clamp 800 thereby presents a lower impedance to the substrate current 318. FIG. 10 illustrates a graph showing the voltage of the over-current protector 202 during a low-to-high transition of the LDMOS device 128 that causes LDMOS device 130 to inject the substrate current 318. However, in the example of FIG. 10, the substrate clamp 800 is connected to ground 144 via a lower inductance (e.g., 1.2 nH). As a result, more substrate current flows out via the substrate clamp 800, thereby decreasing the substrate current 318 flowing via the over-current protector 202. As illustrated in the example of FIG. 10, the voltage drop due to the substrate current 318 is decreased due to the lower impedance between the substrate clamp 800 and ground 144.

Figure 11:
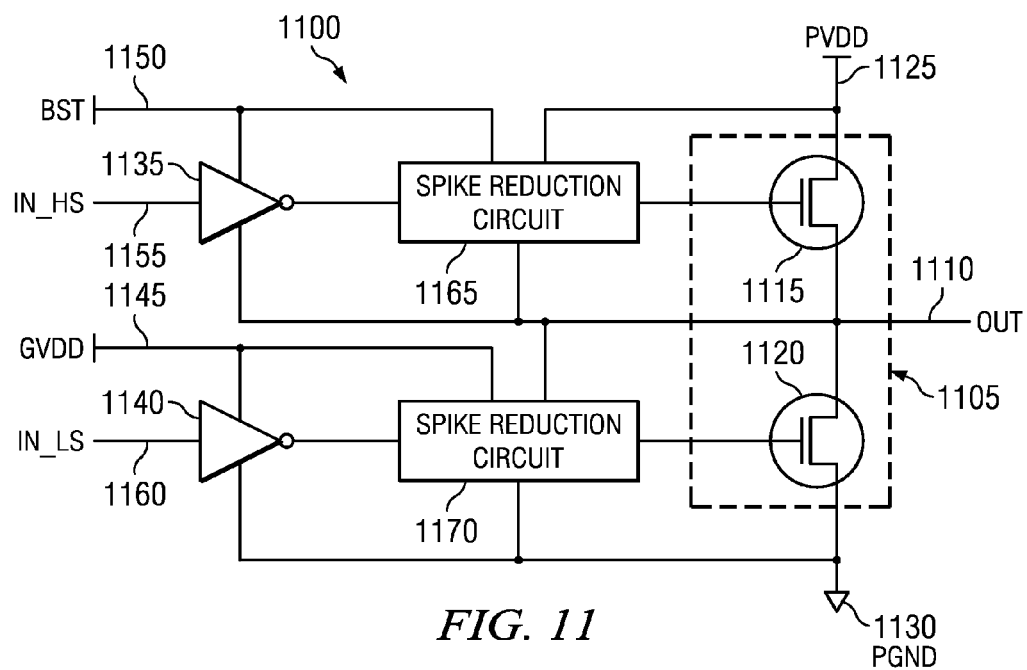
FIG. 11 is a block diagram of a first example half-bridge amplifier circuit including example low-side and high-side spike reduction circuits.

Focusing next on voltage spike reduction, a block diagram of a first example switching half-bridge amplifier circuit 1100 implementing voltage spike reduction according to the methods and/or apparatus described herein is illustrated in FIG. 11. The first example switching half-bridge amplifier circuit 1100 includes an output stage 1105 providing a voltage output 1110 for the amplifier circuit 1100. The example output stage 1105 includes a high-side transistor 1115 and a low-side transistor 1120. In the illustrated example, the high-side transistor 1115 and the low-side transistor 1120 are implemented as a high-side field effect transistor (FET) 1115 and a low-side FET 1120. Of course, other types of transistors could be used to implement the high-side transistor 1115 and the low-side transistor 1120. The voltage output 1110 in the illustrated example is provided by the node at which the source of the high-side FET 1115 is coupled with the drain of the low-side FET 1120. The drain of the high-side FET 1115 is coupled to a high-side voltage input 1125, such as, for example, PVDD 1125 as shown in FIG. 11. The source of the low-side FET 1120 is coupled to a low-side power voltage input 1130, such as, for example, PGND 1130 as shown.

To control operation of the high-side FET 1115 and the low-side FET 1120, the first example switching half-bridge amplifier circuit 1100 includes respective high-side and low-side drivers 1135 and 1140. The low-side driver 1140 is powered by a low-side gate power input 1145, such as, for example, GVDD 1145 as shown in FIG. 11. The high-side driver 1135 is powered by a high-side gate power input 1150, such as, for example, a bootstrap power input BST 1150 as shown.

The example high-side driver 1135 is coupled to a high-side control input 1155 used to control whether the high-side FET 1115 is switched ON or OFF. In the illustrated example, the high-side driver 1135 is configured to generate an output control voltage to turn ON the high-side FET 1115 when the high-side control input 1155 is set to a logic HIGH value, and to turn OFF the high-side FET 1115 when the high-side control input 1155 is set to a logic LOW value. Similarly, the example low-side driver 1140 is coupled to a low-side control input 1160 used to control whether the low-side FET 1120 is switched ON or OFF. In the illustrated example, the low-side driver 1140 is configured to generate an output control voltage to turn ON the low-side FET 1120 when the low-side control input 1160 is set to a logic HIGH value, and to turn OFF the low-side FET 1120 when the low-side control input 1160 is set to a logic LOW value.

The example switching half-bridge amplifier circuit 1100 further includes a high-side spike reduction circuit 1165 to electrically couple the control output of the high-side driver 1135 to the gate input of the high-side FET 1115. Similarly, the example amplifier circuit 1110 includes a low-side spike reduction circuit 1170 to electrically couple the control output of the low-side driver 1140 to the gate input of the low-side FET 1120. In the illustrated example, both the high-side spike reduction circuit 1165 and the low-side spike reduction circuit 1170 are configured to provide variable pull-down strengths to the gate inputs of the high-side FET 1115 and the low-side FET 1120, respectively. In particular, the spike reduction circuits 1165 and 1170 vary their respective pull-down strengths based on the sensed output voltage at the voltage output 1110 of the example amplifier circuit 1100.

Generally, a pull-down circuit (e.g., such as a pull-down resistor) is provided at an input of a transistor (e.g., such as the FETs 1115 and/or 1120) to provide a stable low voltage reference when the transistor input (e.g., gate input) is set to turn the transistor OFF. The strength of the implemented pull-down circuit is usually chosen as a compromise between increasing transistor switching speed and reducing transistor output voltage spikes. For example, a high pull-down strength (e.g., a low pull-down resistance) typically results in a fast transistor turn OFF and lower power dissipation and idle current, but at the expense of increased transient spikes in the transistor output voltage. Conversely, a low pull-down strength (e.g., a high pull-down resistance) typically results in decreased transient spikes in the transistor output voltage, but at the expense of a slower transistor turn OFF and higher power dissipation and idle current.

As described below in detail, the spike reduction circuits 1165 and 1170, however, are configured to vary their respective pull-down strengths to enable fast transistor turn OFF times while reducing transient output voltage spikes, power consumption and idle currents. In particular, the example spike reduction circuits 1165 and 1170 both provide a higher pull-down strength when initially turning OFF an output stage transistor, and then reduce the pull-down strength as the transistor transitions to a fully OFF state. Turning to the example low-side spike reduction circuit 1170, when the low-side FET 1120 is switched from ON to OFF by the low-side driver 1140 (and the high-side FET 1115 is switched from OFF to ON in a complimentary fashion at substantially the same time, for example, such as within approximately 15 nanoseconds (ns) of the low-side FET 1120 being switched from ON to OFF), the low-side spike reduction circuit 1170 initially provides a high pull-down strength to the gate input of the low-side FET 1120. This high pull-down strength enables initially fast switching of the low-side FET 1120 from ON to OFF. Then, as the output voltage at the voltage output 1110 increases (e.g., such as due to the high-side FET 1115 being switched ON while the low-side FET 1120 is being switched OFF, a load current being forced into the voltage output 1110 when the low-side FET 1120 is being switched OFF, etc.), the low-side spike reduction circuit 1170 senses this increase in output voltage. When the output voltage at the voltage output 1110 reaches a predetermined value, the example low-side spike reduction circuit 1170 reduces the pull-down strength provided to the gate input of the low-side FET 1120. This reduced pull-down strength results in lower transient voltage spikes at the voltage output 1110 as the low-side FET 1120 reaches its fully OFF state.

The example high-side spike reduction circuit 1165 operates in a manner similar to the example low-side spike reduction circuit 1170. In particular, turning to the example high-side spike reduction circuit 1165, when the high-side FET 1115 is switched from ON to OFF by the high-side driver 1135 (and the low-side FET 1120 is switched from OFF to ON in a complimentary fashion at substantially the same time, for example, such as within approximately 15 nanoseconds (ns) of the high-side FET 1115 being switched from ON to OFF), the high-side spike reduction circuit 1165 initially provides a high pull-down strength to the gate input of the high-side FET 1115. This high pull-down strength enables initially fast switching of the high-side FET 1115 from ON to OFF. Then, as the output voltage at the voltage output 1110 decreases (due to the low-side FET 1120 being switched ON while the high-side FET 1115 is being switched OFF), the high-side spike reduction circuit 1165 senses this decrease in output voltage. When the output voltage at the voltage output 1110 reaches a predetermined value, the example high-side spike reduction circuit 1165 reduces the pull-down strength provided to the gate input of the high-side FET 1115. This reduced pull-down strength results in lower transient voltage spikes at the voltage output 1110 as the high-side FET 1115 reaches its fully OFF state.

Figure 12:
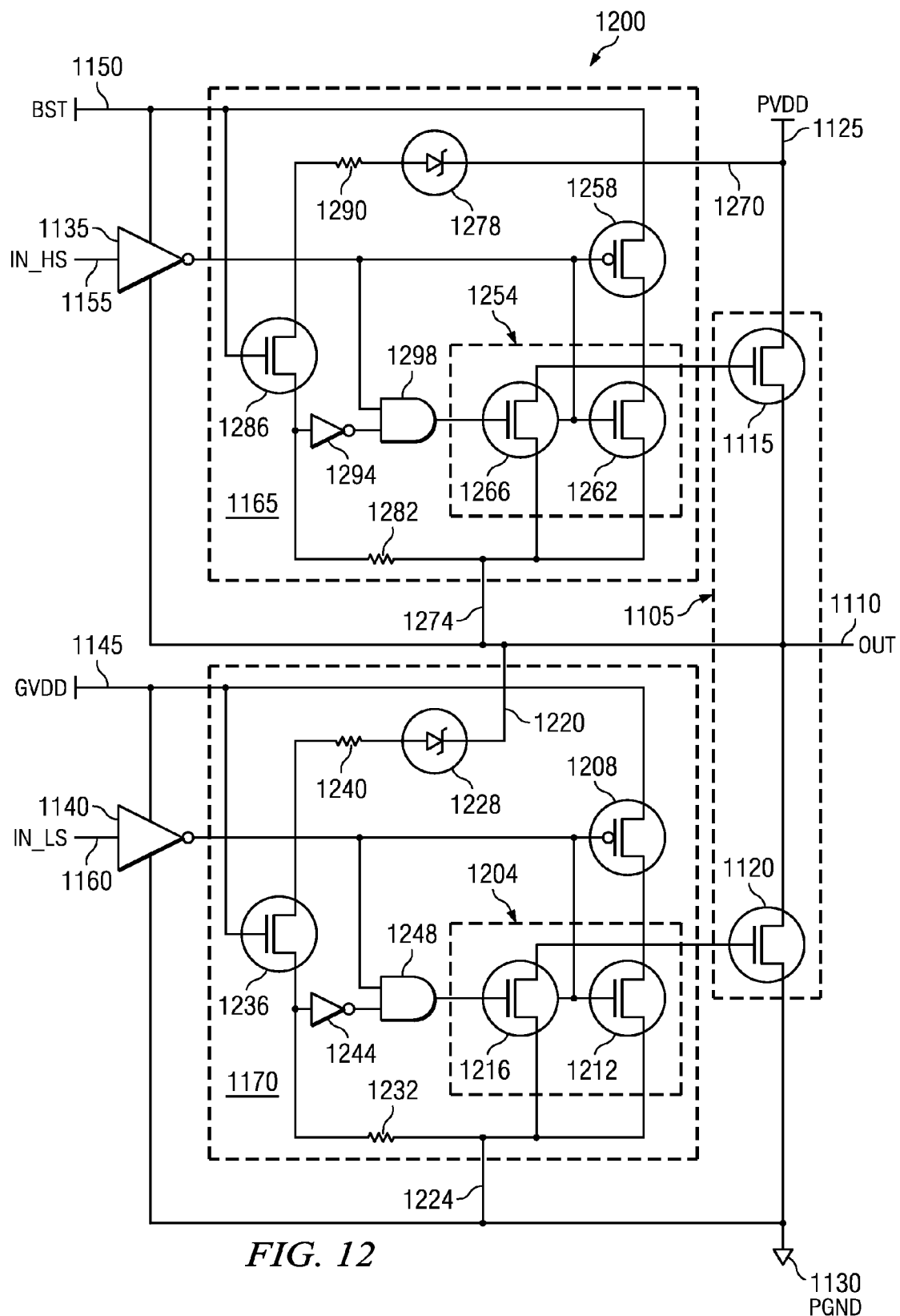
FIG. 12 is a block diagram of a second example half-bridge amplifier circuit illustrating example implementations of the example low-side and high-side spike reduction circuits of FIG. 1.

A block diagram of a second example half-bridge amplifier circuit 1200 that implements voltage spike reduction according to the methods and/or apparatus described herein is illustrated in FIG. 12. The second example half-bridge amplifier circuit 1200 provides more detailed example implementations of the example spike reduction circuits 1165 and 1170 included in the first example switching half-bridge amplifier circuit of FIG. 11. As such, like elements in FIGS. 11 and 12 are labeled with the same reference numerals. For brevity, the detailed descriptions of these like elements are provided above in connection with the discussion of FIG. 11 and, therefore, are not repeated in the discussion of FIG. 12.

Similar to the first example circuit 1100 of FIG. 11, the second example switching half-bridge amplifier circuit 1200 of FIG. 12 includes the output stage 1105 providing the voltage output 1110, the high-side and low-side FETs 1115 and 1120, the high-side and low-side drivers 1135 and 1140 with their respective high-side and low-side control inputs 1155 and 1160, and the high-side and low-side spike reduction circuits 1165 and 1170.

Turning first to the example low-side spike reduction circuit 1170, the example implementation of this circuit as illustrated in FIG. 12 includes a low-side pull-down circuit 1204 configured to be coupled with the gate input of the low-side FET 1120. The low-side pull-down circuit 1204 provides a stable voltage reference for the gate input when the gate input is set to turn OFF the low-side FET 1120. The low-side spike reduction circuit 1170 in the illustrated example also includes a pull-up transistor 1208 implemented as, for example, a pull-up FET 1208. The pull-up FET 1208 implements a pull-up circuit configured to be coupled with the gate input of the low-side FET 1120. The pull-up FET 1208 provides a stable voltage reference for the gate input when the gate input is set to turn ON the low-side FET 1120.

The example low-side pull-down circuit 1204 includes a first pull-down transistor 1212 and a second pull-down transistor 1216. In the illustrated example, the first pull-down transistor 1212 and the second pull-down transistor 1216 are implemented, respectively, as a first pull-down FET 1212 and a second pull-down FET 1216. The first and second pull-down FETs 1212 and 1216 of the illustrated example are configured to allow the strength of the low-side pull-down circuit 1204 to vary based on the output voltage sensed at the voltage output 1110. In particular, the first and second pull-down FETs 1212 and 1216 provide a high pull-down strength (e.g., corresponding to a low resistance path to PGND 1130) for the low-side pull-down circuit 1204 when both FETs are initially turned ON. As discussed above in connection with FIG. 11, this high pull-down strength causes the low-side FET 1120 to begin switching rapidly to the OFF state. Then, at a later time when the output voltage 1110 increases by a predetermined amount, the second pull-down FET 1216 is turned OFF to reduce the pull-down strength (e.g., corresponding to a higher resistance path to PGND 1130) for the low-side pull-down circuit 1204. As discussed above in connection with FIG. 11, this lower pull-down strength causes a reduction in the voltage spikes observed at the output of the low-side FET 1120 and, thus, at the voltage output 1110.

The second pull-down FET 1216 included in the example low-side pull-down circuit 1204 is controlled by the remaining circuitry in the example low-side spike reduction circuit 1170 as follows. As a starting reference point, the low-side FET 1120 is assumed to be ON and the high-side FET 1115 is assumed to be OFF, resulting the output voltage 1110 being substantially equal to the voltage at PGND 1130. For the low-side FET 1120 to be turned ON, the low-side control input 1160 will be set to a logic HIGH value, resulting in a logic LOW value at the output of the low-side driver 1140. A logic LOW value at the output of the low-side driver 1140 causes the pull-up FET 1208 to turn ON and to pull up the gate input of the low-side FET 1120 to a voltage substantially equal to the voltage at GVDD 1145, thereby turning ON the low-side FET 11120.

Next, assume that a logic LOW value is applied to the low-side control input 1160 to turn OFF the low-side FET 1129. This results in a logic HIGH value at the output of the low-side driver 1140, thereby causing the pull-up FET 1208 to turn OFF. Additionally, the logic HIGH value at the output of the low-side driver 1140 causes the first and second pull-down FETs 1212 and 1216 to turn ON. When the first and second pull-down FETs 1212 and 1216 are turned ON, the gate input of the low-side FET 1120 is pulled down to a voltage substantially equal to the voltage at PGND 1130, thereby causing the low-side FET 1120 to begin turning OFF. During normal operation, the high-side FET 1115 will be turned ON at approximately the same time that the low-side FET 1120 is turned OFF, for example, such as within approximately 15 nanoseconds (ns) of the low-side FET 1120 being turned OFF. Thus, when the low-side FET 1120 begins turning OFF, the voltage at the voltage output 1110 will begin increasing to a value substantially equal to the voltage at PVDD 1125.

The low-side spike reduction circuit 1170 includes inputs 1220 and 1224 to sense the voltage at voltage output 1110 and, in particular, the voltage at the voltage output 1110 relative to the other side of the low-side FET 1120. In the illustrated example, the input 1220 is electrically coupled to the cathode of a Zener diode 1228 and the input to 1224 is electrically coupled to the anode of the Zener diode 1228. More specifically, the input 1224 is electrically coupled to the anode of the Zener diode 1228 through a first bias resistor 1232, a bias transistor 1236 and a second bias resistor 1240. In the illustrated example, the bias transistor 1236 is implemented as a bias FET 1236 whose gate input is coupled to GVDD 1145. When the low-side FET 1120 is initially turned OFF after being in the ON state, the voltage at the voltage output 1110 and, thus, at the input 1220 will still be substantially equal to the voltage at PGND 1130. Thus, no current will initially flow through the Zener diode 1228 because it will be only nominally reverse-biased.

With no current initially flowing through the Zener diode 1228, no current will flow through the bias FET 1236 and its source, therefore, will have a voltage substantially equal to PGND 1130 (tied through the first bias resistor 1232). As a result, the source of the bias FET 1236 will provide a logic LOW value to the input of an inverter 1244 which will, in turn, provide a logic HIGH value to one input of an AND gate 1248. When the logic LOW value is applied to the low-side control input 1160 to turn OFF the low side FET 1120, the low-side driver 1140 will provide a logic HIGH value to the other input of the AND gate 1248. With both inputs set to logic HIGH, the output of the AND gate 1248 will be a logic HIGH, thereby turning ON the second pull-down FET 1216. The first pull-down FET 1212 will also be turned ON by the logic HIGH output of the low-side driver 1140. With both pull-down FETs 1212 and 1216 initially turned ON when the low-side FET 1120 is initially configured to turn OFF, a strong pull-down strength (e.g., low pull-down resistance) will be provided at the gate input of the low-side FET 1120. This strong pull-down strength (e.g., low pull-down resistance) will cause the low-side FET 1120 to begin switching rapidly to the OFF state.

After the low side FET 1120 is turned OFF (and the high-side FET 1115 is turned ON at approximately the same time, for example, such as within approximately 15 nanoseconds (ns) of the low-side FET 1120 being turned OFF), the voltage at the voltage output 1110 and, thus, at the input 1220 will then begin to increase. When the voltage difference between the inputs 1220 and 1224 exceeds the reverse breakdown voltage of the Zener diode 1228, the Zener diode 1228 will enter avalanche mode. Once in avalanche mode, current will flow through the Zener diode 1228 and, thus, through the bias FET 1236. In the illustrate example, the Zener diode 1228 and the bias resistors 1232 and 1240 are chosen such that: (1) the Zener diode 1228 will avalanche at a predetermined voltage value and (2) the voltage at the source of the bias FET 1236 will correspond to a logic HIGH value when the Zener diode 1228 enters avalanche mode. In an example implementation with PVDD 1125 set to 150 volts and PGND 1130 set to 0 volts, the Zener diode 1228 and the bias resistors 1232 and 1240 are chosen such that: (1) the Zener diode 1228 will avalanche when the voltage difference between the inputs 1220 and 1224 is 125 volts (e.g., when the voltage at the voltage output 1110 increases by 125 volts from the voltage at PGND 1130) and (2) the voltage at the source of the bias FET 1236 will be substantially equal to the voltage at GVDD 1145 when the Zener diode 1228 enters avalanche mode.

When the Zener diode 1228 enters avalanche mode at the predetermined voltage difference between the inputs 1220 and 1224 (or, equivalently, when the voltage at the voltage output 1110 increases a predetermined amount above the voltage at PGND 1130), the source of the bias FET 1236 will be a logic HIGH value. This logic HIGH value is provided to the input of the inverter 1244 which will, in turn, provide a logic LOW value to one input of the AND gate 1248. With one input set to logic LOW, the output of the AND gate 1248 will be a logic LOW, thereby turning OFF the second pull-down FET 1216. The first pull-down FET 1212 will still be turned ON by the logic HIGH output of the low-side driver 1140. With the first pull-down FET 1212 turned ON and the second pull-down FET 1216 now turned OFF, a reduced pull-down strength (e.g., higher pull-down resistance) will be provided at the gate input of the low-side FET 1120. This reduced pull-down strength (e.g., higher pull-down resistance) will cause a reduction in the voltage spikes observed at the output of the low-side FET 1120 and, thus, at the voltage output 1110.

The example implementation of the high-side spike reduction circuit 1165 illustrated in FIG. 12 is similar to the example implementation of the low-side spike reduction circuit 1170. The operation of the example high-side spike reduction circuit 1165 is also similar to the operation of the example low-side spike reduction circuit 1170 in the illustrated example. For example, the illustrated implementation of the high-side spike reduction circuit 1165 includes a pull-down circuit 1254 and a pull-up FET 1258 similar to the pull-down circuit 1204 and pull-up FET 1208 included in the example low-side spike reduction circuit 1170. Like the pull-down circuit 1204, the pull-down circuit 1254 also includes a first pull-down FET 1262 and a second pull-down FET 1266 configured to allow the strength of the high-side pull-down circuit 1254 to vary based on the output voltage sensed at the voltage output 1110. In particular, the first and second pull-down FETs 1262 and 1266 provide a high pull-down strength (e.g., corresponding to a low resistance path to the voltage output 1110) for the high-side pull-down circuit 1254 when both FETs are initially turned ON. As discussed above in connection with FIG. 11, this high pull-down strength causes the high-side FET 1115 to begin switching rapidly to the OFF state. Then, at a later time when the output voltage 1110 decreases by a predetermined amount, the second pull-down FET 1266 is turned OFF to reduce the pull-down strength (e.g., corresponding to a higher resistance path to PGND 1130) for the high-side pull-down circuit 1254. As discussed above in connection with FIG. 11, this lower pull-down strength causes a reduction in the voltage spikes observed at the output of the high-side FET 1115 and, thus, at the voltage output 1110.

Similar to the second pull-down FET 1216 included in the example low-side pull-down circuit 1204, the pull-down FET 1266 included in the example high-side pull-down circuit 1254 is controlled by the remaining circuitry in the example high-side spike reduction circuit 1165. Like for the example low-side spike reduction circuit 1170, the example high-side spike reduction circuit 1165 includes inputs 1270 and 1274 to sense the voltage at voltage output 1110 and, in particular, the voltage at the voltage output 1110 relative to the other side of the high-side FET 1115. In the illustrated example, the input 1270 is electrically coupled to the cathode of a Zener diode 1278 and the input 1274 is electrically coupled to the anode of the Zener diode 1278. Similar to the configuration of the Zener diode 1228 of the example low-side spike reduction circuit 1170, in the example high-side spike reduction circuit 1165 the input 1274 is electrically coupled to the anode of the Zener diode 1278 through a first bias resistor 1282, a bias transistor 1286 and a second bias resistor 1290. Additionally, the source of the bias FET 1286 included in the high-side spike reduction circuit 1165 is coupled to an inverter 1294 which, in turn, drives an input of an AND gate 1298, which is also like the illustrated implementation of the example low-side spike reduction circuit 1170.

Similar to the operation of the example low-side spike reduction circuit 1170, when the high-side FET 1115 is initially turned OFF after being in the ON state, the voltage at the voltage output 1110 and, thus, at the input 1270 of the example high-side spike reduction circuit 1165 will still be substantially equal to the voltage at PVDD 1125. Thus, no current will initially flow through the Zener diode 1278 because it will be only nominally reverse-biased. With no current initially flowing through the Zener diode 1278, the source of the bias FET 1286 will provide a logic LOW value to the input of an inverter 1294 which will, in turn, provide a logic HIGH value to one input of an AND gate 1298. When the logic LOW value is applied to the high-side control input 1155 to turn OFF the high side FET 1115, the high-side driver 1135 will provide a logic HIGH value to the other input of the AND gate 1298. With both inputs set to logic HIGH, the output of the AND gate 1298 will be a logic HIGH, thereby turning ON the second pull-down FET 1266. The first pull-down FET 1262 will also be turned ON by the logic HIGH output of the high-side driver 1135. With both pull-down FETs 1262 and 1266 initially turned ON when the high-side FET 1115 is initially configured to turn OFF, a strong pull-down strength (e.g., low pull-down resistance) will be provided at the gate input of the high-side FET 1115. This strong pull-down strength (e.g., low pull-down resistance) will cause the high-side FET 1115 to begin switching rapidly to the OFF state.

After the high-side FET 1115 is turned OFF (and the low-side FET 1120 is turned ON at approximately the same time, for example, such as within approximately 15 nanoseconds (ns) of the high-side FET 1115 being turned OFF), the voltage at the voltage output 1110 and, thus, at the input 1274 will then begin to decrease. When the voltage difference between the inputs 1270 and 1274 exceeds the reverse breakdown voltage of the Zener diode 1278, the Zener diode 1278 will enter avalanche mode. Once in avalanche mode, current will flow through the Zener diode 1278 and, thus, through the bias FET 1286. Like for the example low-side spike reduction circuit 1170, the Zener diode 1278 and the bias resistors 1232 and 1240 of the illustrated example high-side spike reduction circuit 1165 are chosen such that: (1) the Zener diode 1278 will avalanche at a predetermined voltage value and (2) the voltage at the source of the bias FET 1286 will correspond to a logic HIGH value when the Zener diode 1278 enters avalanche mode. In an example implementation with PVDD 1125 set to 150 volts and PGND 1130 set to 0 volts, the Zener diode 1278 and the bias resistors 1282 and 1290 are chosen such that: (1) the Zener diode 1278 will avalanche when the voltage difference between the inputs 1270 and 1274 is 125 volts (e.g., when the voltage at the voltage output 1110 decreases by 125 volts from the voltage at PVDD 1125) and (2) the voltage at the source of the bias FET 1286 will be substantially equal to the voltage at BST 1150 when the Zener diode 1278 enters avalanche mode.

When the Zener diode 1278 enters avalanche mode at the predetermined voltage difference between the inputs 1270 and 1274 (or, equivalently, when the voltage at the voltage output 1110 decreases a predetermined amount below the voltage at PVDD 1125), the source of the bias FET 1286 will be a logic HIGH value. This logic HIGH value is provided to the input of the inverter 1294 which will, in turn, provide a logic LOW value to one input of the AND gate 1298. With one input set to logic LOW, the output of the AND gate 1298 will be a logic LOW, thereby turning OFF the second pull-down FET 1266. The first pull-down FET 1262 will still be turned ON by the logic HIGH output of the high-side driver 1135. With the first pull-down FET 1262 turned ON and the second pull-down FET 1266 now turned OFF, a reduced pull-down strength (e.g., higher pull-down resistance) will be provided at the gate input of the high-side FET 1115. This reduced pull-down strength (e.g., higher pull-down resistance) will cause a reduction in the voltage spikes observed at the output of the high-side FET 1115 and, thus, at the voltage output 1110.

Although the illustrated example implementations of the pull-down circuits 1204 and 1254 each include a pair of pull-down transistors coupled in a parallel configuration (e.g., the pull-down transistors 1212 and 1216, and the pull-down transistors 1262 and 1266, respectively), other example implementations of the pull-down circuits 1204 and/or 1254 could include any number of pull-down transistors. In general, increasing the number of pull-down transistors used to implement the pull-down circuits 1204 and/or 1254 (with a corresponding increase in the complexity of the associated control circuitry, including an increase in the number of Zener diodes 1228 and/or 1278), will increase the granularity of the pull-down strength variations supported by the corresponding high-side spike reduction circuit 1165 and/or low-side spike reduction circuit 1170. Additionally, although the illustrated example implementations of the high-side spike reduction circuit 1165 and the low-side spike reduction circuit 1170 each include only a single pull-up transistor (e.g., the pull-up transistors 1208 and 1258), other example implementations of the high-side spike reduction circuit 1165 and/or the low-side spike reduction circuit 1170 can employ pull-up circuits having any number of pull-up transistors. Like their pull-down counterparts, pull-up circuits having more than one pull-up transistor are capable of providing variable pull-up strengths to further reduce voltage spikes at the output of switching half-bridge amplifier circuits.

Figure 13:
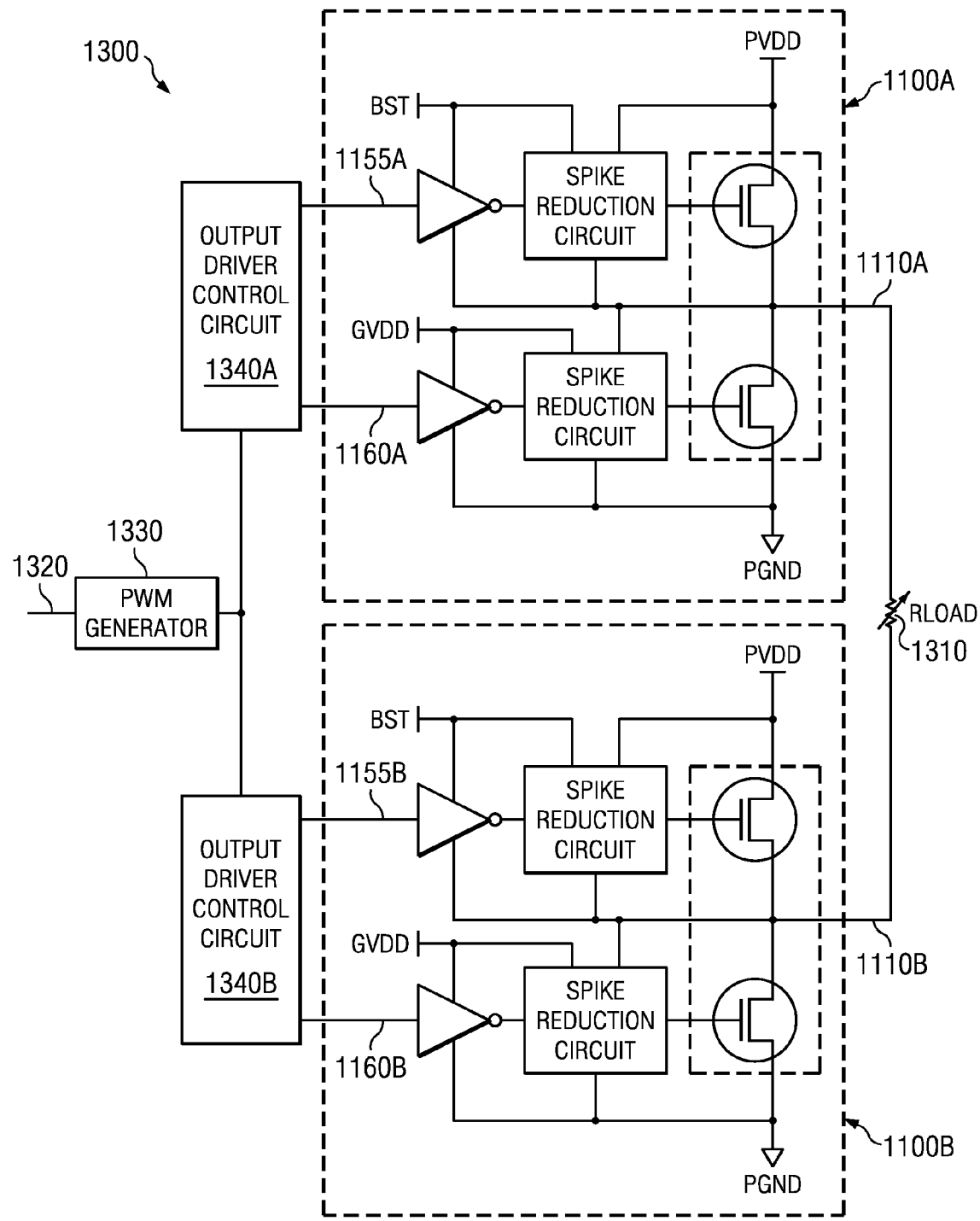
FIG. 13 is a block diagram of an example full-bridge class-D amplifier implemented using two of the example half-bridge amplifier circuits of FIG. 1.

To illustrate an example application of switching half-bridge amplifiers employing the voltage spike reduction methods and/or apparatus described herein, a block diagram of an example full-bridge class-D amplifier 1300 implemented using two of the example switching half-bridge amplifier circuits 1100 of FIG. 11 is illustrated in FIG. 13. The two instances of the example switching half-bridge amplifier circuit 1100 in FIG. 13 are labeled 1100A and 1100B for clarity. In the example class-D amplifier 1300, the two example switching half-bridge amplifier circuits 1100A and 1100B are coupled in a full-bridge output configuration. As such, the voltage output 1110A of the switching half-bridge amplifier circuit 1100A is coupled to one end of an output load 1310 and the voltage output 1110B of the switching half-bridge amplifier circuit 1100B is coupled to the other end of the output load 1310. The output load 1310 can be any type of load capable of being driven by a class-D amplifier, such as, for example, a speaker, another audio amplifier, an audio line input to an audio device, etc.

In a full-bridge configuration, the switching half-bridge amplifier circuits 1100A and 1100B are operated in a complimentary, yet opposite, fashion. In particular, in the illustrated example, the switching half-bridge amplifier circuits 1100A and 1100B are configured such that either: (1) the high-side FET of the switching half-bridge amplifier circuit 1100A is ON and low-side FET of the switching half-bridge amplifier circuit 1100B is ON, or (2) the low-side FET of the switching half-bridge amplifier circuit 1100A is ON and the high-side FET of the switching half-bridge amplifier circuit 1100B is ON. The configuration of the high-side FET of the switching half-bridge amplifier circuit 1100A being ON and the low-side FET of the switching half-bridge amplifier circuit 1100B being ON corresponds to a first voltage phase of approximately +PVDD volts across the output load 1310. The configuration of the low-side FET of the switching half-bridge amplifier circuit 1100A being ON and the high-side FET of the switching half-bridge amplifier circuit 1100B being ON corresponds to a second voltage phase of approximately −PVDD volts across the output load 1310.

The full-bridge output configuration of the example class-D amplifier 1300 is switched between its two output voltage phases of approximately +PVDD volts and approximately −PVDD volts, respectively, according to an electrical signal to be amplified (e.g., such as an audio signal). The electrical signal to be amplified is applied to an amplifier input 1320 of the example class-D amplifier 1300. As in a conventional class-D amplifier, the amplifier input 1320 of the example class-D amplifier 1300 drives a pulse width modulation (PWM) generator 1330. The example PWM generator 1330 generates a PWM output signal that includes a stream of pulses having widths that vary as a function of the input signal applied to the amplifier input 1320. In an example implementation, the PWM generator 1330 generates its PWM output signal by comparing the signal applied to the amplifier input 1320 with a reference ramp signal. The PWM generator 1330 in this example implementation then outputs a logical HIGH value when the value of the input signal exceeds the value of the ramp signal and a logical LOW value when the value of the input signal does not exceed the value of the ramp signal. The PWM output signal, therefore, is a pulse train, wherein the pulse widths represent the periods of time during which the input signal applied to the amplifier input 1320 exceeded the reference ramp signal.

The PWM output signal from the example PWM generator 1330 is applied to two output driver control circuits 1340A and 1340B that control, respectively, the switching half-bridge amplifier circuits 1100A and 1100B. The output driver control circuits 1340A and 1340B are configured to control the switching half-bridge amplifier circuits 1100A and 1100B such that the full-bridge output is switched to its first output voltage phase of approximately +PVDD volts when the PWM output signal corresponds to a logic HIGH value, and to its second output voltage phase of approximately −PVDD volts when the PWM output signal corresponds to a logic LOW value.

For example, to switch the full-bridge output to its first output voltage phase of approximately +PVDD volts, the output driver control circuit 1340A is configured to assert a logic HIGH value at the high-side control input 1155A and a logic LOW value at the low-side control input 1160A to turn ON the high-side FET (and turn OFF the low-side FET) of the example switching half-bridge amplifier circuit 1100A. Furthermore, the output driver control circuit 1340B is configured to assert a logic LOW value at the high-side control input 1155B and a logic HIGH value at the low-side control input 1160B to turn ON the low-side FET (and turn OFF the high-side FET) of the example switching half-bridge amplifier circuit 1100B. Conversely, to switch the full-bridge output to its second output voltage phase of approximately −PVDD volts, the output driver control circuit 1340A is configured to assert a logic LOW value at the high-side control input 1155A and a logic HIGH value at the low-side control input 1160A to turn ON the low-side FET (and turn OFF the high-side FET) of the example switching half-bridge amplifier circuit 1100A. Furthermore, the output driver control circuit 1340B is configured to assert a logic HIGH value at the high-side control input 1155B and a logic LOW value at the low-side control input 1160B to turn ON the high-side FET (and turn OFF the low side FET) of the example switching half-bridge amplifier circuit 1100B. Because the high-side and low-side FETs of the example switching half-bridge amplifier circuits 1100A and 1100B will continually switch between ON states and OFF states according to the PWM pulse stream output by the example PWM generator 1330, the example voltage spike reduction circuits included in the switching half-bridge amplifier circuits 1100A and 1100B will have a tendency to reduce the voltage spikes observed at the output load 1310 relative to a conventional class-D amplifier implementation.

Figure 14:
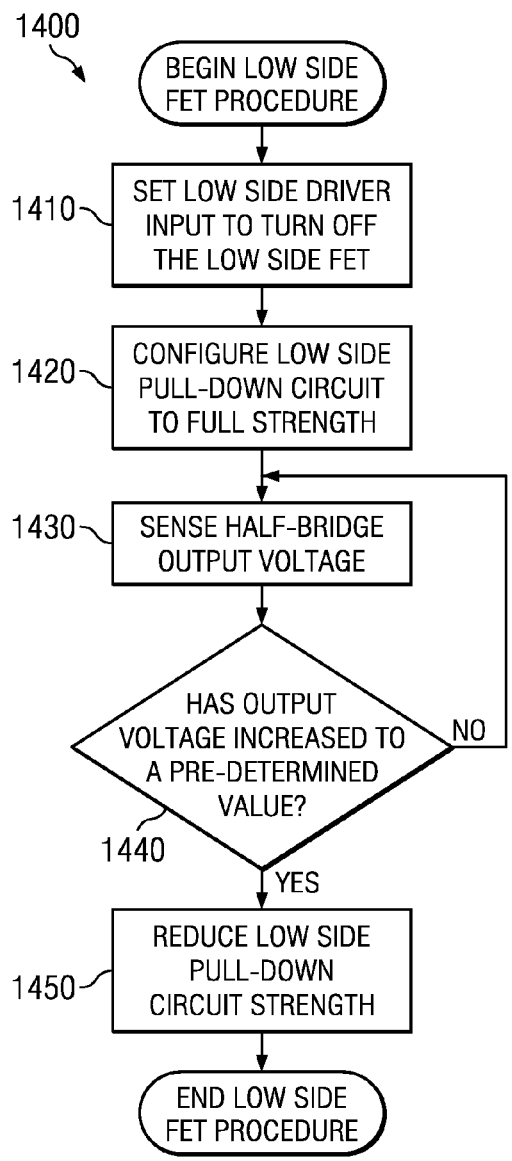
FIG. 14 is a flowchart representative of an example process that may be performed to implement the example low-side spike reduction circuits of FIGS. 1 and/or 12.
Figure 15:
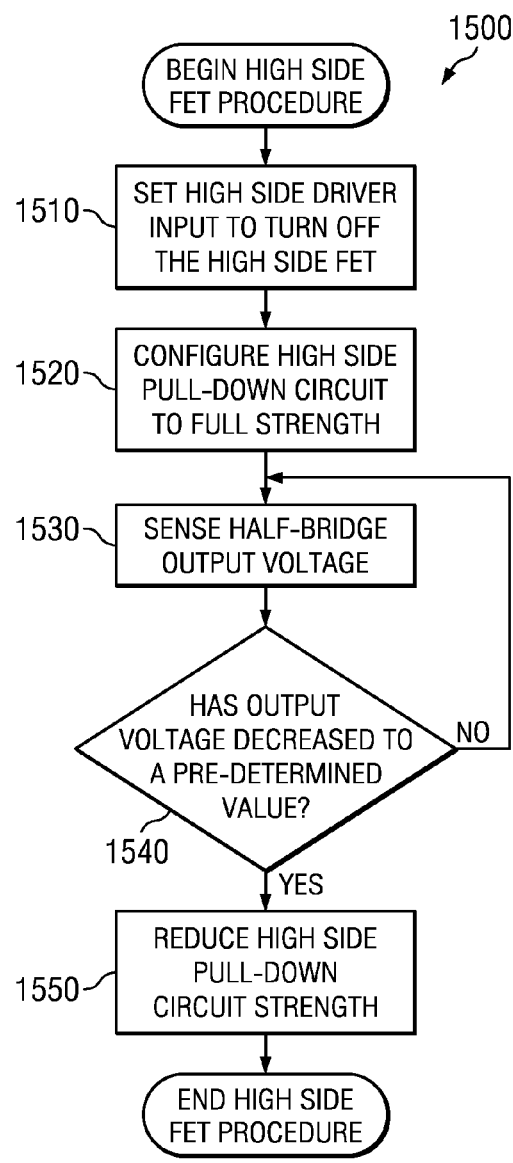
FIG. 15 is a flowchart representative of an example process that may be performed to implement the example high-side spike reduction circuits of FIGS. 11 and/or 12.

Flowcharts representative of example processes that may be implemented by all, or at least portions of, for example, the example switching half-bridge amplifier circuits 1100 and/or 1200, the example high-side spike reduction circuit 1165, the example low-side spike reduction circuit 1170, the example low-side pull-down circuit 1204, the example high-side pull-down circuit 1254, and/or the example class-D amplifier 1300 are shown in FIGS. 14 and 15. Additionally or alternatively, any, all or portions thereof of the example switching half-bridge amplifier circuits 1100 and/or 1200, the example high-side spike reduction circuit 1165, the example low-side spike reduction circuit 1170, the example low-side pull-down circuit 1204, the example high-side pull-down circuit 1254, and/or the example class-D amplifier 1300, and/or the example processes represented by the flowcharts of FIGS. 14 and/or 15 could be implemented by any combination of software, firmware, hardware devices and/or combinational logic, other circuitry, etc., such as the hardware circuitry and transistors, etc., shown in FIGS. 11-13. Furthermore, the process represented by each flowchart may be implemented by one or more programs comprising machine readable instructions for execution by: (a) a processor, such as the processor 1612 shown in the example system 1600 discussed below in connection with FIG. 16, (b) a controller, and/or (c) any other suitable device. The one or more programs may be embodied in software stored on a tangible medium such as, for example, a flash memory, a CD-ROM, a floppy disk, a hard drive, a DVD, or a memory associated with the processor 1612, but persons of ordinary skill in the art will readily appreciate that the entire program or programs and/or portions thereof could alternatively be executed by a device other than the processor 1612 and/or embodied in firmware or dedicated hardware (e.g., implemented by an application specific integrated circuit (ASIC), a programmable logic device (PLD), a field programmable logic device (FPLD), discrete logic, etc.). Also, some or all of the processes represented by the flowcharts of FIGS. 14 and 15 may be implemented manually. Further, although the example processes are described with reference to the flowcharts illustrated in FIGS. 14 and 15, persons of ordinary skill in the art will readily appreciate that many other techniques for implementing the example methods and apparatus described herein may alternatively be used. For example, with reference to the flowcharts illustrated in FIGS. 14 and 15, the order of execution of the blocks may be changed, and/or some of the blocks described may be changed, eliminated, combined and/or subdivided into multiple blocks.

An example process 1400 that may be implemented by the example low-side spike reduction circuit 1170 of FIGS. 11 and/or 12 is illustrated in FIG. 14. The example process 1400 may be performed continuously, based on an occurrence of a predetermined event (e.g., such as when the low-side control input 1160 is set to a logic LOW value to turn OFF the low-side FET 1120), etc., or any combination thereof. The example process 1400 begins execution at block 1410 at which the low-side control input 1160 of the example low-side spike reduction circuit 1170 is set to a logic LOW value to turn OFF the example low-side FET 1120 in the output stage 1105 of the example switching half-bridge amplifier circuit 1100 and/or 1200. Control then proceeds to block 1420 at which the example low-side spike reduction circuit 1170 is configured to provide its full pull-down strength to the gate input of the example low-side FET 1120 to turn OFF the example low-side FET 1120. For example, at block 1420 both the first and second pull-down FETs 1212 and 1216 included in the example low-side pull-down circuit 1204 of the example low-side spike reduction circuit 1170 may be turned ON to provide a high pull-down strength (e.g., corresponding to a low resistance path to PGND 1130) to the gate input of the example low-side FET 1120.

Next, control proceeds to block 1430 at which the inputs 1220 and 1224 of the example low-side spike reduction circuit 1170 sense the output voltage at the voltage output 1110 of the example switching half-bridge amplifier circuit 1100 and/or 1200. For example, at block 1430 the inputs of the Zener diode 1228 may be used to sense the voltage at the voltage output 1110 and, in particular, the voltage at the voltage output 1110 relative to the other side of the low-side FET 1120. Control then proceeds to block 1440 at which the example low-side spike reduction circuit 1170 determines whether the voltage at the voltage output 1110 has increased to a predetermined value. For example, at block 1440 the voltage at the voltage output 1110 is determined to have increased to the predetermined value when the Zener diode 1228 enters avalanche mode. If the voltage at the voltage output 1110 has not increased to the predetermined value (block 1440), control returns to block 1430 at which the example low-side spike reduction circuit 1170 continues to sense the output voltage at the voltage output 1110.

However, if the voltage at the voltage output 1110 has increased to the predetermined value (block 1440), control proceeds to block 1450 at which the example low-side spike reduction circuit 1170 is configured to reduce its pull-down strength provided to the gate input of the example low-side FET 1120. For example, at block 1450 the second pull-down FET 1216 included in the example low-side pull-down circuit 1204 of the example low-side spike reduction circuit 1170 may be turned OFF to reduce the pull-down strength (e.g., increase the pull-down resistance) provided at the gate input of the low-side FET 1120. Execution of the example process 1400 then ends.

An example process 1500 that may be implemented by the example high-side spike reduction circuit 1165 of FIGS. 11 and/or 12 is illustrated in FIG. 15. The example process 1500 may be performed continuously, based on an occurrence of a predetermined event (e.g., such as when the high-side control input 1155 is set to a logic LOW value to turn OFF the high-side FET 1115), etc., or any combination thereof. The example process 1500 begins execution at block 1510 at which the high-side control input 1155 of the example high-side spike reduction circuit 1165 is set to a logic LOW value to turn OFF the example high-side FET 1115 in the output stage 1105 of the example switching half-bridge amplifier circuit 1100 and/or 1200. Control then proceeds to block 1520 at which the example high-side spike reduction circuit 1165 is configured to provide its full pull-down strength to the gate input of the example high-side FET 1115 to turn OFF the example high-side FET 1115. For example, at block 1520 both the first and second pull-down FETs 1262 and 1266 included in the example high-side pull-down circuit 1254 of the example high-side spike reduction circuit 1165 may be turned ON to provide a high pull-down strength (e.g., corresponding to a low resistance path to the voltage output 1110) to the gate input of the example high-side FET 1115.

Next, control proceeds to block 1530 at which the inputs 1270 and 1274 of the example high-side spike reduction circuit 1165 sense the output voltage at the voltage output 1110 of the example switching half-bridge amplifier circuit 1100 and/or 1200. For example, at block 1530 the inputs of the Zener diode 1278 may be used to sense the voltage at the voltage output 1110 and, in particular, the voltage at the voltage output 1110 relative to the other side of the high-side FET 1115. Control then proceeds to block 1540 at which the example high-side spike reduction circuit 1165 determines whether the voltage at the voltage output 1110 has decreased to a predetermined value. For example, at block 1540 the voltage at the voltage output 1110 is determined to have decreased to the predetermined value when the Zener diode 1278 enters avalanche mode. If the voltage at the voltage output 1110 has not decreased to the predetermined value (block 1540), control returns to block 1530 at which the example high-side spike reduction circuit 1165 continues to sense the output voltage at the voltage output 1110.

However, if the voltage at the voltage output 1110 has decreased to the predetermined value (block 1540), control proceeds to block 1550 at which the example high-side spike reduction circuit 1165 is configured to reduce its pull-down strength provided to the gate input of the example high-side FET 1115. For example, at block 1550 the second pull-down FET 1266 included in the example high-side pull-down circuit 1254 of the example high-side spike reduction circuit 1165 may be turned OFF to reduce the pull-down strength (e.g., increase the pull-down resistance) provided at the gate input of the high-side FET 1115. Execution of the example process 1500 then ends.

Figure 16:
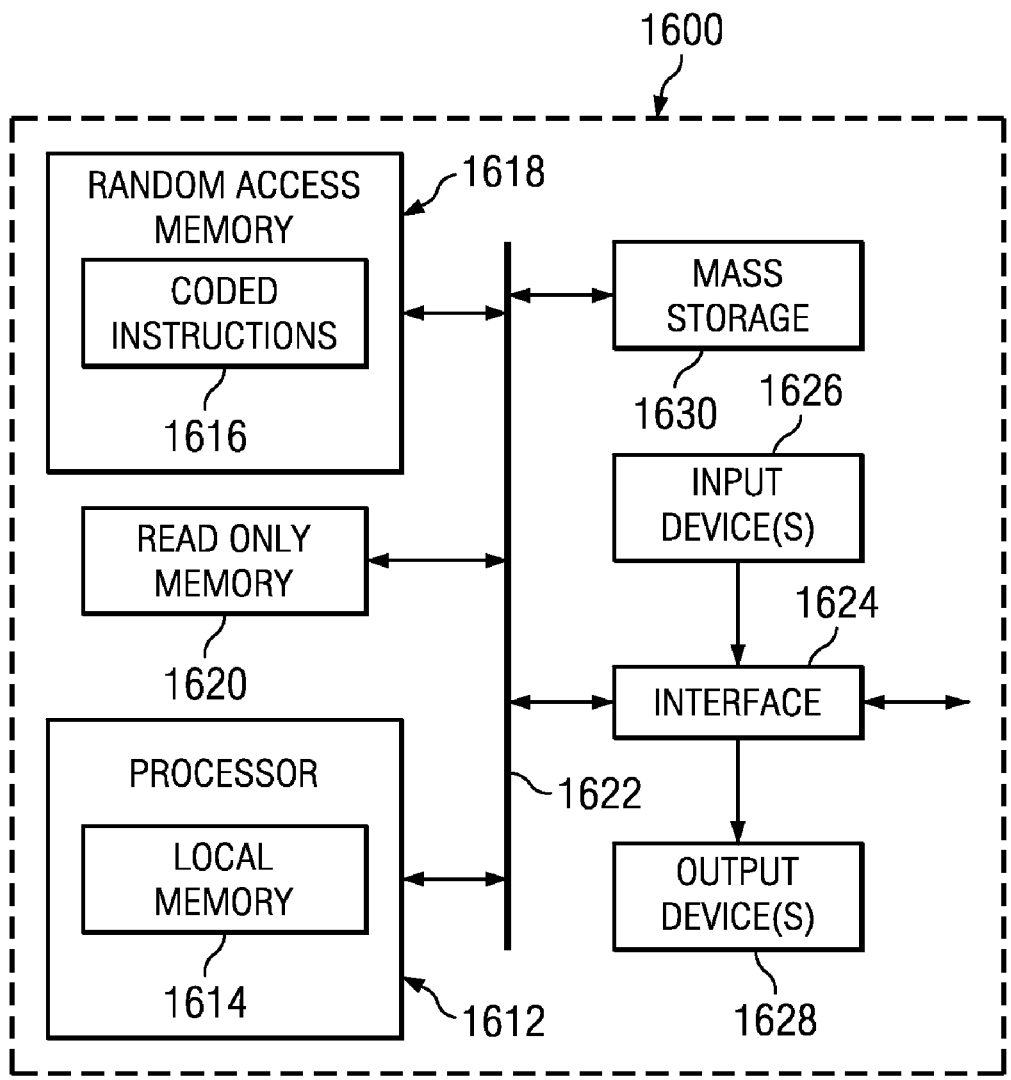
FIG. 16 is a block diagram of an example computer that may execute example machine readable instructions used to implement some or all of the processes of FIGS. 15 and/or 16 to implement the example half-bridge amplifiers of FIGS. 11 and/or 12, and/or the example full-bridge class-D amplifier of FIG. 13.

FIG. 16 is a block diagram of an example system 1600 capable of implementing the apparatus and methods disclosed herein. The system 1600 can be, for example, a server, a personal computer, a personal digital assistant (PDA), an Internet appliance, a DVD player, a CD player, a digital video recorder, a personal video recorder, a set top box, or any other type of computing device.

The system 1600 of the instant example includes a processor 1612 such as a general purpose programmable processor. The processor 1612 includes a local memory 1614, and executes coded instructions 1616 present in the local memory 1614 and/or in another memory device. The processor 1612 may execute, among other things, machine readable instructions to implement some or all of the processes represented in FIGS. 14 and/or 15. The processor 1612 may be any type of processing unit, such as one or more microprocessors from the Texas Instruments OMAP® family of microprocessors. Of course, other processors from other families are also appropriate.

The processor 1612 is in communication with a main memory including a volatile memory 1618 and a non-volatile memory 1620 via a bus 1622. The volatile memory 1618 may be implemented by Static Random Access Memory (SRAM), Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1620 may be implemented by flash memory and/or any other desired type of memory device. Access to the main memory 1618, 1620 is typically controlled by a memory controller (not shown).

The system 1600 also includes an interface circuit 1624. The interface circuit 1624 may be implemented by any type of interface standard, such as an Ethernet interface, a universal serial bus (USB), and/or a third generation input/output (3GIO) interface. In an example implementation of the full-bridge class-D amplifier 1300 based on the example system 700, the interface circuit 724 may implement the full-bridge class-D amplifier 1300 to provide an interface between the amplifier input 1320 and the output load 1310.

One or more input devices 1626 are connected to the interface circuit 1624. The input device(s) 1626 permit a user to enter data and commands into the processor 1612. The input device(s) can be implemented by, for example, a keyboard, a mouse, a touchscreen, a track-pad, a trackball, an isopoint and/or a voice recognition system.

One or more output devices 1628 are also connected to the interface circuit 1624. The output devices 1628 can be implemented, for example, by display devices (e.g., a liquid crystal display, a cathode ray tube display (CRT)), by a printer and/or by speakers. The interface circuit 1624, thus, typically includes a graphics driver card.

The interface circuit 1624 also includes a communication device such as a modem or network interface card to facilitate exchange of data with external computers via a network (e.g., an Ethernet connection, a digital subscriber line (DSL), a telephone line, coaxial cable, a cellular telephone system, etc.).

The system 1600 also includes one or more mass storage devices 1630 for storing software and data. Examples of such mass storage devices 1630 include floppy disk drives, hard drive disks, compact disk drives and digital versatile disk (DVD) drives. The mass storage device 1630 may be used to store machine readable instructions to implement the example processes 1400 and/or 1500 of FIGS. 14 and 15, respectively. Alternatively, the volatile memory 1618 may be used to store machine readable instructions to implement the example processes 1400 and/or 1500.

As an alternative to implementing the methods and/or apparatus described herein in a system such as the device of FIG. 16, the methods and or apparatus described herein may be embedded in a structure such as a processor and/or an ASIC (application specific integrated circuit).

Additionally, the examples disclosed herein have typically assumed certain voltage polarities for the operational characteristics of the devices, components, circuit elements, etc., used to implement the example methods and apparatus disclosed herein. In these examples, certain positive voltages and/or voltages exceeding a threshold may cause a particular device, component, circuit element, etc., to exhibit one characteristic (e.g., such as turning ON), whereas certain non-positive (e.g., zero and/or negative) voltages and/or voltages not exceeding a threshold may cause the device, component, circuit element, etc., to exhibit a different characteristic (e.g., such as turning OFF). However, it is readily apparent that the methods and apparatus described herein can be used in example implementations based on different, or opposite, polarity definitions.

Furthermore, in the examples described herein, methods and apparatus to reduce substrate bounce effects from substrate currents are disclosed. The substrate clamp provides a low impedance path to ground when substrate currents are injected into the substrate. As a result, substrate currents do not affect the circuit. Although the examples described relate to switching amplifiers, persons having ordinary skill in the art will readily appreciate that substrate clamp may be implemented into any number of electrical circuits to reduce substrate currents. For example, the substrate clamp may be implemented in power supplies, mixed-mode integrated circuits, etc.

Finally, although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. An apparatus comprising:
 a switching amplifier formed on a substrate of a first conduction type having:
  a pulse width modulator;
  a protection circuit that is coupled to pulse width modulator;
  a high-side driver that is coupled to protection circuit;
  a low-side driver that is coupled to the protection circuit;
  a high-side transistor that is coupled to the high-side driver and a switching node; and
  a low-side transistor that is coupled to the low-side driver and the switching node;
 a voltage regulator formed on the substrate and coupled to the protection circuit; and
 a well of the first conduction type located in the substrate; and
 a substrate clamp having:
  a shallow well of a second conduction type located in the substrate and that is coupled to the well of the first conduction type;
  a deep well of the second conduction type located in the substrate and substantially surrounding the shallow well; and a buried layer located in the substrate beneath at least a portion of the deep well.

2. The apparatus of claim 1, wherein the protection circuit further comprises an over-current protector that is coupled to the voltage regulator.

3. The apparatus of claim 2, wherein the switching amplifier further comprises:
a first spike reduction circuit that is coupled between the high-side driver and the high-side switch; and
a second spike reduction circuit that is coupled between the low-side driver and the low-side switch.

4. The apparatus of claim 3, wherein the first conduction type is p-type and the second conduction type is n-type.

5. The apparatus of claim 4, wherein the apparatus further comprises a first pad formed over at least a portion of the well of the first conduction type, and wherein the substrate clamp further comprises a second pad formed over at least a portion of the shallow well, and wherein an electrical connection is formed between the first and second pads.

6. The apparatus of claim 4, wherein the well of the first conduction type further comprises a plurality of wells that are each coupled to the shallow well.

7. An apparatus comprising:
a switching amplifier formed on a substrate of a first conduction type having:
a pulse width modulator;
a protection circuit that is coupled to pulse width modulator;
a plurality of drivers, wherein each driver is coupled to protection circuit;
an H-bridge that is coupled to the plurality of drivers;
a voltage regulator formed on the substrate and coupled to the protection circuit; and
a well of the first conduction type located in the substrate; and
a substrate clamp having:
a shallow well of a second conduction type located in the substrate and that is coupled to the well of the first conduction type;
a deep well of the second conduction type located in the substrate and substantially surrounding the shallow well; and
a buried layer located in the substrate beneath at least a portion of the deep well.

8. The apparatus of claim 7, wherein the protection circuit further comprises an over-current protector that is coupled to the voltage regulator.

9. The apparatus of claim 8, wherein the switching amplifier further comprises a plurality of spike reduction circuits, wherein each spike protection circuit is coupled between at least one of the drivers and the H-bridge.

10. The apparatus of claim 9, wherein the first conduction type is p-type and the second conduction type is n-type.

11. The apparatus of claim 10, wherein the apparatus further comprises a first pad formed over at least a portion of the well of the first conduction type, and wherein the substrate clamp further comprises a second pad formed over at least a portion of the shallow well, and wherein an electrical connection is formed between the first and second pads.

12. The apparatus of claim 10, wherein the well of the first conduction type further comprises a plurality of wells that are each coupled to the shallow well.

\* \* \* \* \*